(12) United States Patent
    Shibagaki et al.

(10) Patent No.: US 9,991,119 B2
(45) Date of Patent: Jun. 5, 2018

(54) HEAT TREATMENT METHOD AND HEAT TREATMENT APPARATUS FOR SEMICONDUCTOR SUBSTRATE

(71) Applicant: CANON ANELVA CORPORATION, Kawasaki-shi (JP)

(72) Inventors: Masami Shibagaki, Kawasaki (JP); Yasuko Shinoda, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days. days.

(21) Appl. No.: 15/272,484

(22) Filed: Sep. 22, 2016

(65) Prior Publication Data
US 2017/0011921 A1    Jan. 12, 2017

Related U.S. Application Data

(63) Continuation of application No. PCT/JP2015/001686, filed on Mar. 24, 2015.

(30) Foreign Application Priority Data

Mar. 24, 2014 (JP) .................................. 2014-060584

(51) Int. Cl.
    *H01L 21/336* (2006.01)
    *H01L 21/04* (2006.01)
    (Continued)

(52) U.S. Cl.
    CPC ........ *H01L 21/0475* (2013.01); *H01L 21/049* (2013.01); *H01L 21/3247* (2013.01);
    (Continued)

(58) Field of Classification Search
    None
    See application file for complete search history.

(56) References Cited

U.S. PATENT DOCUMENTS 7,682,991 B2 *  3/2010  Kawada .............. H01L 21/0475
                                               257/E21.182
8,129,663 B2    3/2012  Masaki et al.
(Continued)

FOREIGN PATENT DOCUMENTS

JP    2008-177538 A    7/2008
JP    2009-147118 A    7/2009
(Continued)

OTHER PUBLICATIONS

International Search Report in International Application No. PCT/JP2015/001686 (dated May 19, 2015).
(Continued)

*Primary Examiner* — Ali Naraghi
(74) *Attorney, Agent, or Firm* — Fitzpatrick, Cella, Harper & Scinto

(57) ABSTRACT

A heat treatment method for a semiconductor substrate is provided which improves the shapes of the sharp corners at the opening and the bottom of a trench without using flammable or explosive gas while improving productivity. The heat treatment is performed on a semiconductor substrate with a recess formed therein in a treatment chamber where gas is sealed at a pressure exceeding a pressure in a molecular flow region.

7 Claims, 11 Drawing Sheets

(51) Int. Cl.
*H01L 21/324* (2006.01)
*H01L 29/66* (2006.01)
*H01L 29/16* (2006.01)
*H01L 21/67* (2006.01)
*H01L 29/78* (2006.01)

(52) U.S. Cl.
CPC .... *H01L 21/67109* (2013.01); *H01L 29/1608* (2013.01); *H01L 29/66068* (2013.01); *H01L 29/7813* (2013.01); *H01L 21/046* (2013.01)

(56) References Cited

U.S. PATENT DOCUMENTS

| | | | |
|---|---|---|---|
| 8,187,958 B2 | 5/2012 | Shibagaki et al. | |
| 8,426,323 B2 | 4/2013 | Masaki et al. | |
| 8,691,676 B2 | 4/2014 | Shibagaki et al. | |
| 9,018,699 B2 | 4/2015 | Kiyosawa et al. | |
| 9,147,742 B2 | 9/2015 | Doi et al. | |
| 9,431,281 B2 | 8/2016 | Shibagaki et al. | |
| 2003/0219948 A1* | 11/2003 | Kuribayashi | H01L 21/28158 438/270 |
| 2009/0218579 A1 | 9/2009 | Shibagaki | |
| 2010/0226630 A1* | 9/2010 | Shibagaki | F27B 17/0025 392/416 |
| 2010/0243618 A1 | 9/2010 | Shibagaki et al. | |
| 2013/0082282 A1 | 4/2013 | Suzuki | |
| 2014/0308028 A1 | 10/2014 | Mashimo et al. | |

FOREIGN PATENT DOCUMENTS

| | | |
|---|---|---|
| JP | 2009-289987 A | 12/2009 |
| JP | 2013-077761 A | 4/2013 |
| WO | 2013/042333 A1 | 3/2013 |
| WO | 2013/099063 A1 | 7/2013 |
| WO | 2015/146162 A1 | 10/2015 |

OTHER PUBLICATIONS

International Preliminary Report on Patentability (Chapter II) in International Application No. PCT/JP2015/001686 (dated Mar. 24, 2016).

* cited by examiner

HEAT TREATMENT METHOD AND HEAT TREATMENT APPARATUS FOR SEMICONDUCTOR SUBSTRATE

CROSS-REFERENCE TO RELATED APPLICATIONS

This application is a continuation application of International Application No. PCT/JP2015/001686, filed Mar. 24, 2015, which claims the benefit of Japanese Patent Application No. 2014-060584 filed Mar. 24, 2014. The contents of the aforementioned applications are incorporated herein by reference in their entireties.

BACKGROUND OF THE INVENTION

Field of the Invention

The present invention relates to a heat treatment method and a heat treatment apparatus for a semiconductor substrate.

Description of the Related Art

In order to reduce the on resistance of a semiconductor power device, there have been proposed various trench FETs using a silicon carbide (SiC) substrate (see Japanese Patent Application Laid-open No. 2013-077761, for example). As to such trench FETs, a trench formed in a semiconductor substrate by dry etching treatment using a dry etching apparatus or the like is known to have sharp corners at the opening and the bottom thereof.

The sharp corners at the trench sometimes causes coating defects at the time of coating of a gate insulation film, leading to the occurrence of voids when an electrode embedded into the trench is formed, and, as a result, significantly affects device characteristics of the semiconductor device. In addition, the sharp corners at the trench may cause electric field concentration leading to a problem of the gate insulation film such as an electrical breakdown, and thus the improvement is being demanded.

To address this, there has been proposed a method to ensure reliability of the gate insulation film by making the sharp corners at the opening and the bottom of the trench rounded to ease the electric field concentration (see Japanese Patent Application Laid-open No. 2008-177538). Japanese Patent Application Laid-open No. 2008-177538 discloses that a process of making the sharp corners at the opening and the bottom of the trench rounded involves first heat treatment in an Ar gas atmosphere or a $SiH_4$ gas/inert gas atmosphere in a temperature range of 1600° C. to 1800° C., inclusive, and a second heat treatment in a hydrogen atmosphere at 1400° C. to 1500° C., inclusive.

SUMMARY OF THE INVENTION

However, since the process disclosed in Patent Japanese Patent Application Laid-open No. 2008-177538 involves the first heat treatment in the Ar gas atmosphere or the $SiH_4$ gas/inert gas atmosphere in the temperature range of 1600° C. to 1800° C., inclusive, and the second heat treatment in the hydrogen atmosphere at 1400° C. to 1500° C., inclusive, there is apprehension that performing the first heat treatment and the second heat treatment may decrease the productivity significantly. In addition, there is also apprehension that using flammable $SiH_4$ gas and explosive hydrogen gas requires auxiliary equipment related to safety such as dedicated gas introduction lines, a gas detector, and a waste gas treatment apparatus, resulting in a significant increase in cost.

The present invention was made in light of the above problem, and an object thereof is to provide a heat treatment method and a heat treatment apparatus for a semiconductor substrate that are capable of improving the shape of a trench without using flammable or explosive gas while improving productivity.

According to an aspect of the present invention, a heat treatment method for a semiconductor substrate is provided in which heat treatment is performed on a semiconductor substrate with a recess formed therein in a treatment chamber where gas is sealed at a pressure exceeding a pressure in a molecular flow region.

According to another aspect of the present invention, a heat treatment apparatus for a semiconductor substrate is provided which includes: a treatment chamber in which heat treatment is performed on a semiconductor substrate; heating means provided in the treatment chamber; and a control apparatus that performs the heat treatment with the heating means on a semiconductor substrate with a recess formed therein in the treatment chamber where gas is sealed at a pressure exceeding a pressure in a molecular flow region.

According to the present invention, by performing the heat treatment on a semiconductor substrate with a trench having sharp corners, it is possible to make the corners of the trench rounded while controlling the width of the trench with a high productivity without necessity of expensive auxiliary equipment.

DESCRIPTION OF THE EMBODIMENTS

Figure 1:
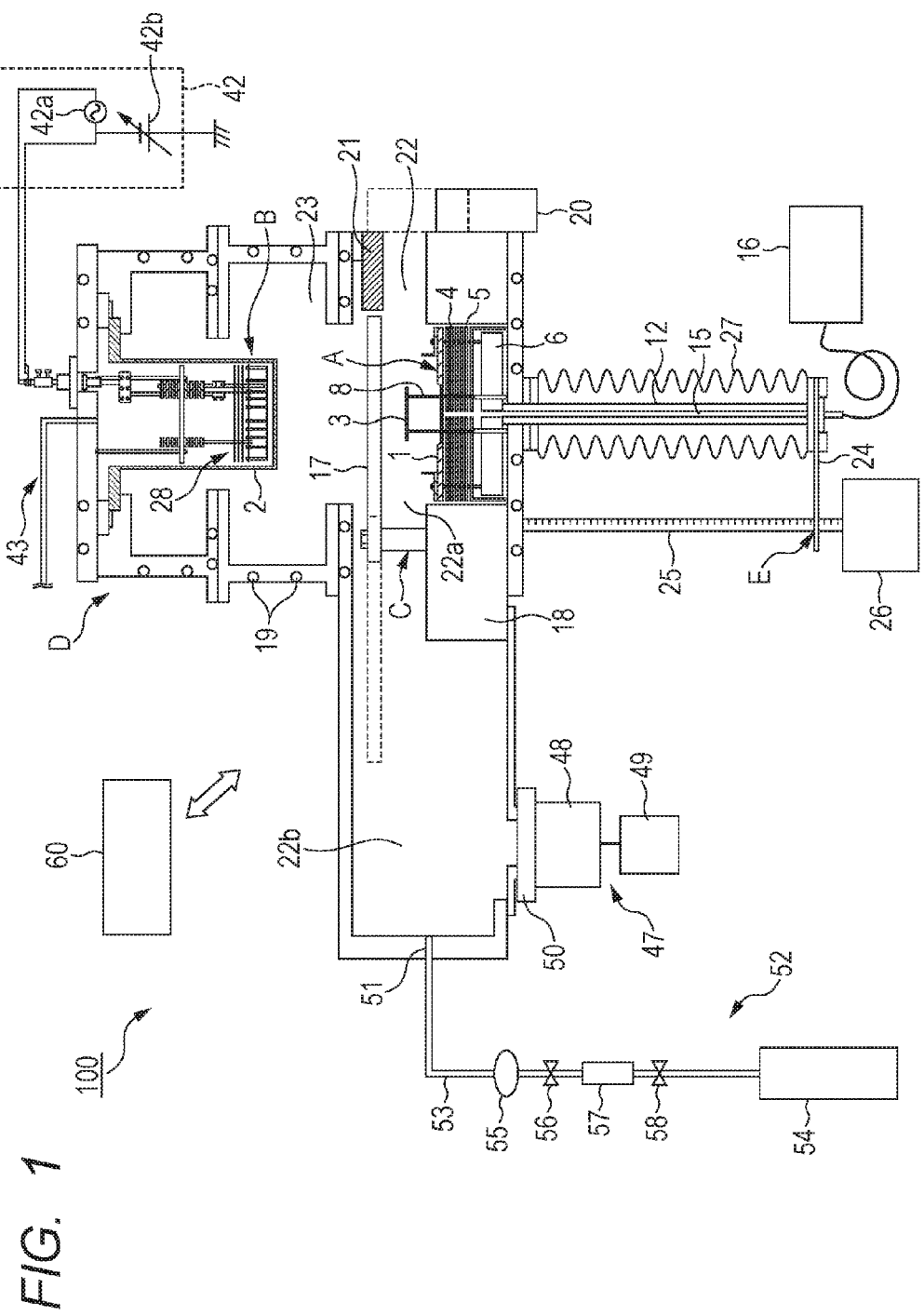
FIG. 1 is a schematic cross-sectional view (part 1) illustrating a heat treatment apparatus according to an embodiment of the present invention.

Hereinafter, an embodiment of the present invention is described referring to the drawings. Note that the present invention is not limited to the embodiment below, and modifications can be made as appropriate without departing from the gist of the invention. In addition, in the drawings to be explained hereafter, constituents having the same functions are denoted by the same reference numerals, and explanations therefor may be omitted or simplified.

(Heat Treatment Apparatus)

Figure 2:
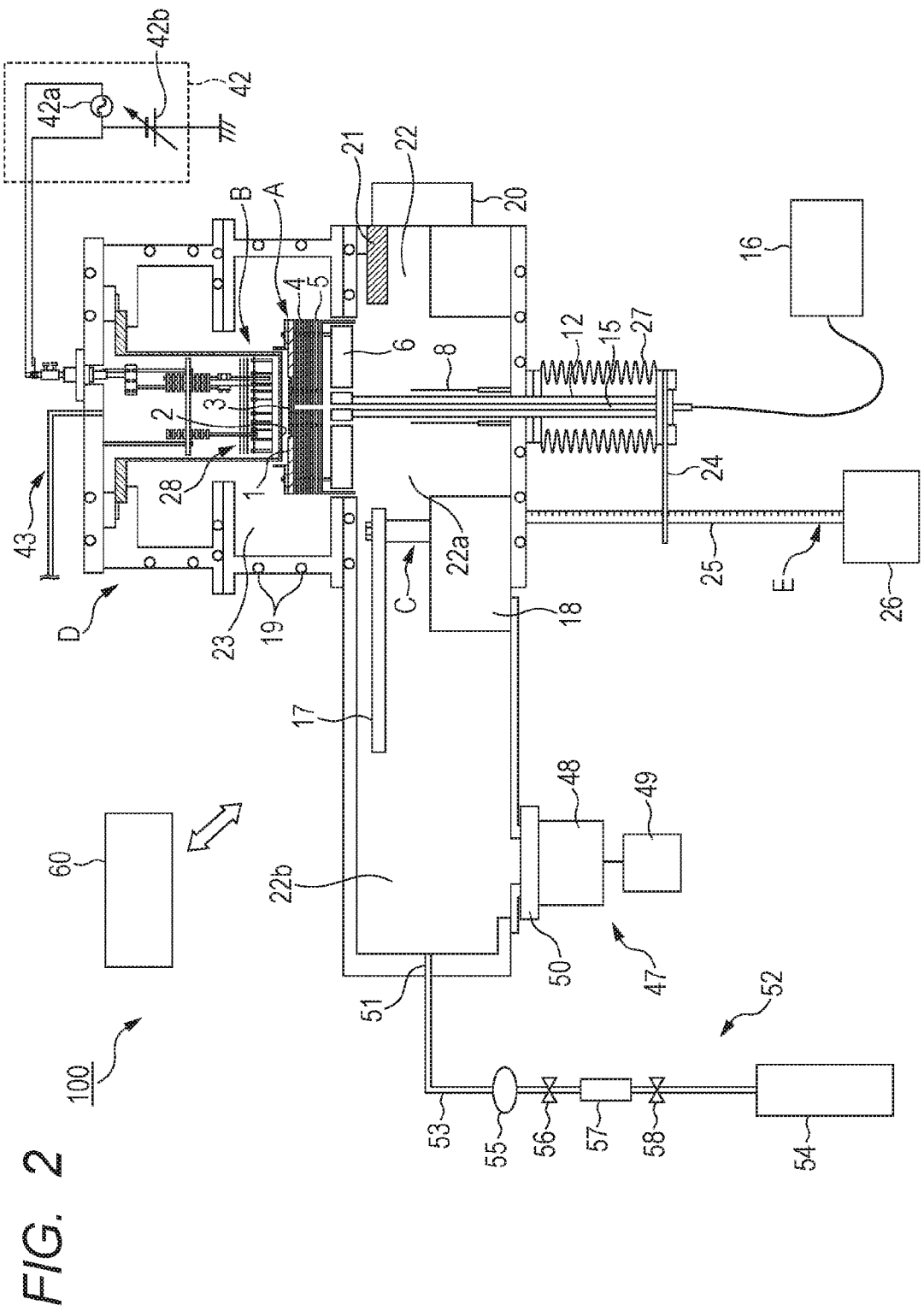
FIG. 2 is a schematic cross-sectional view (part 2) illustrating the heat treatment apparatus according to the embodiment of the present invention.
Figure 3:
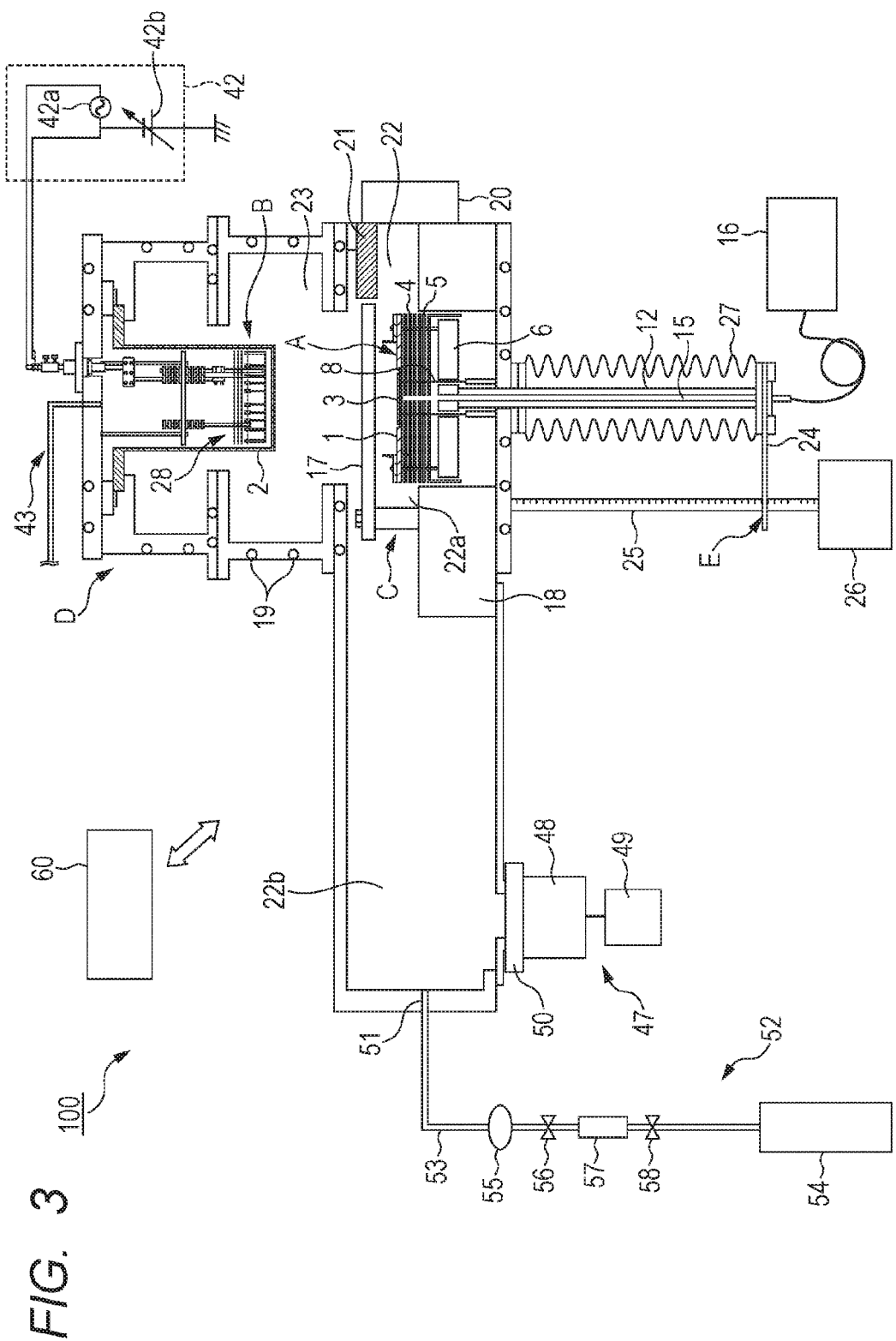
FIG. 3 is a schematic cross-sectional view (part 3) illustrating the heat treatment apparatus according to the embodiment of the present invention.
Figure 4:
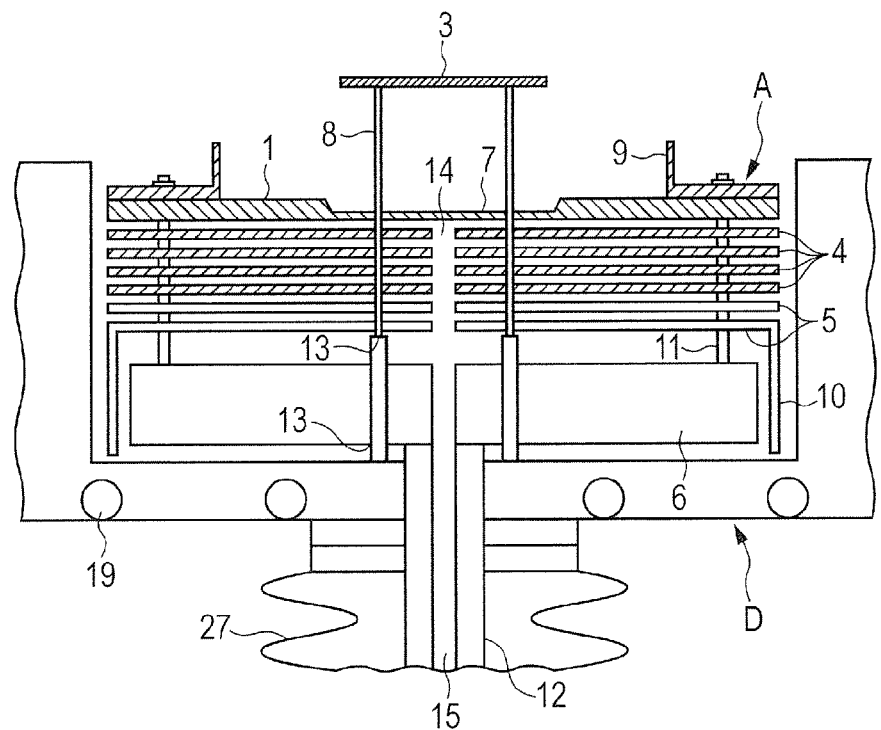
FIG. 4 is a schematic cross-sectional view (part 1) illustrating a substrate holder unit and its periphery in the heat treatment apparatus according to the embodiment of the present invention.
Figure 5:
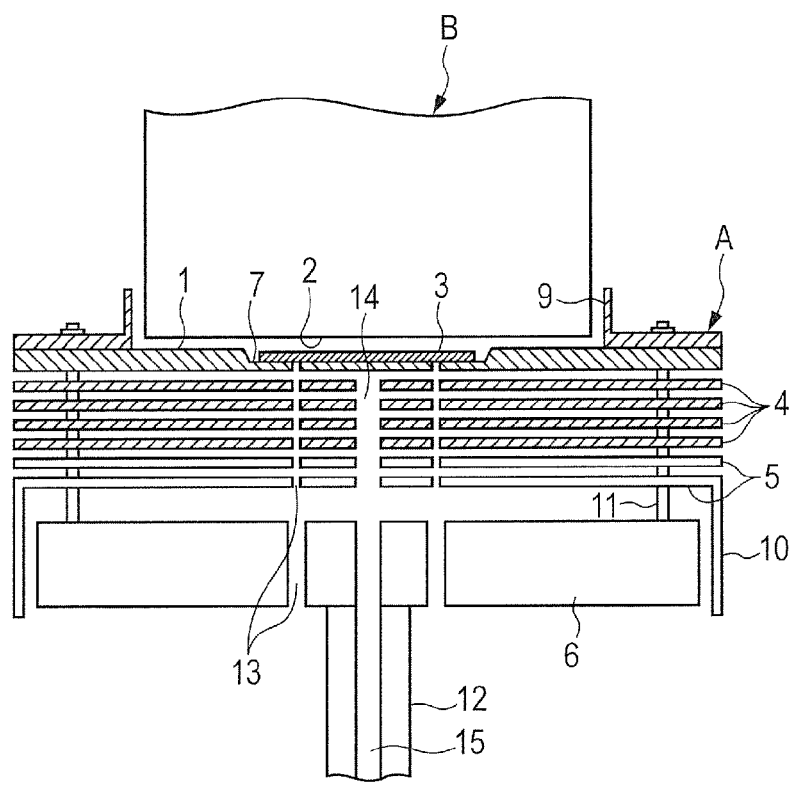
FIG. 5 is a schematic cross-sectional view (part 2) illustrating the substrate holder unit and its periphery in the heat treatment apparatus according to the embodiment of the present invention.
Figure 6:
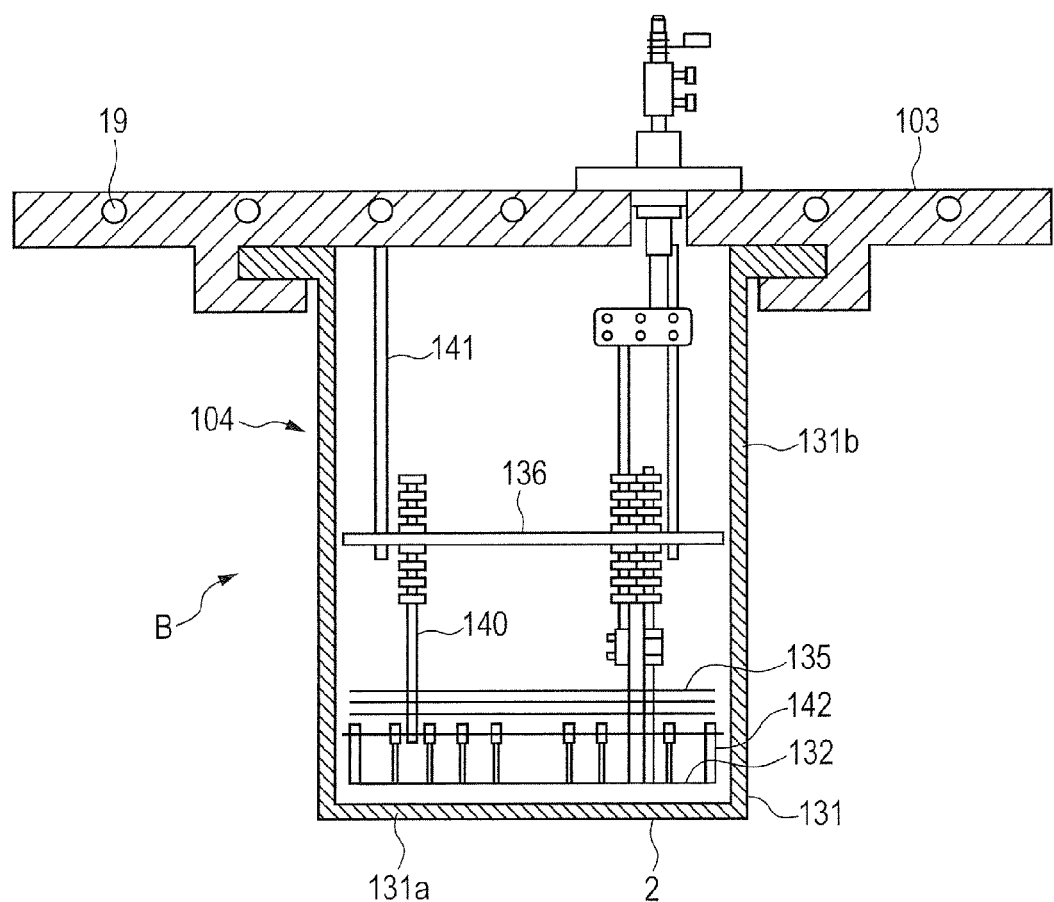
FIG. 6 is a schematic cross-sectional view illustrating a heater unit in the heat treatment apparatus according to the embodiment of the present invention.

First, a heat treatment apparatus 100 according to an embodiment of the present invention is described using FIGS. 1 to 6. FIG. 1 illustrates the heat treatment apparatus 100 in the state for loading or unloading a semiconductor substrate. FIG. 2 illustrates the heat treatment apparatus 100 in the state where heat treatment is performed on the semiconductor substrate. FIG. 3 illustrates the heat treatment apparatus 100 in the state where the semiconductor substrate is cooled down. FIG. 4 illustrates an enlarged view of a substrate holder unit A and its periphery in FIG. 1. FIG. 5 illustrates an enlarged view of the substrate holder unit A and its periphery in FIG. 2. FIG. 6 illustrates an example of a specific structure of a heater unit B.

As illustrated in FIGS. 1 to 3, the heat treatment apparatus 100 according to the embodiment includes the substrate holder unit A, which is substrate holding means; the heater unit B, which is heating means; a shutter apparatus C; and a vacuum chamber D serving as a treatment chamber. In addition, the heat treatment apparatus 100 includes a control apparatus 60 to control the entire operation of the heat treatment apparatus. The substrate holder unit A, the heater unit B, and the shutter apparatus C are provided in the vacuum chamber D, which is in the treatment chamber.

The substrate holder unit A includes a substrate stage 1 at the top thereof. The heater unit B is provided above the substrate stage 1 and includes a substrate opposed face 2, which is opposed to the substrate stage 1. The substrate opposed face 2 of the heater unit B is configured to be capable of radiating heat as described later. The substrate holder unit A is configured to be able to be lifted up and down by a lifting apparatus E. The movement of bringing closer and parting the substrate stage 1 and the substrate opposed face 2 of the heater unit B can be controlled by the operation of the lifting apparatus E. As illustrated in FIG. 2, the heater unit B is configured to heat a semiconductor substrate 3 with radiant heat radiated from the substrate opposed face 2 without contacting the semiconductor substrate 3, when the substrate holder unit A is lifted up, and the semiconductor substrate 3 on the substrate stage 1 and the substrate opposed face 2 are brought closer.

The substrate holder unit A illustrated in FIG. 1 is at a lift-down position and in the state where the semiconductor substrate 3 can be loaded into the vacuum chamber D, or unloaded from the vacuum chamber D. The substrate holder unit A illustrated in FIG. 2 is at a lift-up position and in the state where the semiconductor substrate 3 is subjected to the heat treatment. The substrate holder unit A illustrated in FIG. 3 is at the lift-down position after the heat treatment and in the state where the semiconductor substrate 3 is cooled down. The enlarged view of the substrate holder unit A and its periphery illustrated in FIG. 1 is FIG. 4, and the enlarged view of the substrate holder unit A and its periphery illustrated in FIG. 2 is FIG. 5.

As illustrated in FIGS. 4 and 5, the substrate holder unit A for holding the semiconductor substrate 3 includes the substrate stage 1 at the top, four radiation plates 4 under the substrate stage 1, two reflection plates 5 under the radiation plates 4, and a cooling panel 6 at the bottom.

The substrate stage 1 is where the semiconductor substrate 3, which is subjected to the heat treatment, is placed. The substrate stage 1 has a concave portion formed at the center of the upper surface thereof, and this concave portion serves as a substrate placement portion 7, where the semiconductor substrate 3 is placed. The semiconductor substrate 3 illustrated in FIG. 4 is in the state where the semiconductor substrate 3 is lifted up and supported by lift pins 8 described later. When the lifting apparatus E lifts up the substrate holder unit A to move up the substrate stage 1 to a position higher than the lift pins 8, the semiconductor substrate 3 is handed over to and placed on the substrate placement portion 7 as illustrated in FIG. 5.

The semiconductor substrate 3 subjected to the heat treatment is a semiconductor substrate in which impurities are doped by ion implantation or the like, for example. Specifically, a SiC substrate, a gallium nitride (GaN) substrate, and the like can be cited as the semiconductor substrate 3. Note that what is called the semiconductor substrate includes not only a very semiconductor substrate but also a semiconductor substrate on which a semiconductor film is formed in addition and a support substrate with a semiconductor film formed thereon.

Between the substrate stage 1 and the cooling panel 6, the four radiation plates 4 and the two reflection plates 5 are provided in this order in the direction from the substrate stage 1 to the cooling panel 6 with intervals in between.

In the FIG. 4, the multiple lift pins 8 provided and standing at the bottom of the vacuum chamber D protrude from the substrate stage 1 passing through lift-pin through holes 13. The number and positions of the lift pins 8 are arranged such that the front ends of the lift pins 8 are able to lift and support the semiconductor substrate 3 placed on the substrate placement portion 7. When the substrate holder unit A is lifted up from the state illustrated in FIG. 4, and the substrate stage 1 moves up higher than the lift pins 8, the semiconductor substrate 3 is transferred to and placed on the substrate placement portion 7. In the state where the semiconductor substrate 3 is thus placed on the substrate placement portion 7, the semiconductor substrate 3 is subjected to the heat treatment by the heater unit B. It is preferable that the lift pins 8 be made of a material that has a high radiation rate, absorbs radiant heat efficiently, and endures high temperatures, as with the substrate stage 1.

After the heat treatment or on other occasions, when the substrate holder unit A is lifted down in the state where the semiconductor substrate 3 is placed on the substrate placement portion 7, the lift pins 8 protrude from the substrate stage 1 passing through the lift-pin through holes 13. Then, the semiconductor substrate 3 on the substrate placement portion 7 is lifted up and supported by the front ends of the lift pins 8 and becomes in the state illustrated in FIG. 4.

The heater unit B includes the substrate opposed face 2 to be opposed to the semiconductor substrate 3 and a heating mechanism 28 to heat the substrate opposed face 2. For the heating mechanism 28 of the heater unit B, a heating mechanism of an electron bombardment heating method, a heating mechanism of a high frequency induction heating method, a heating mechanism of a resistance heating method, a heating mechanism of an infrared heating method, and a heating mechanism of combination thereof can be used.

An example of a specific structure of the heater unit B is illustrated in FIG. 6. FIG. 6 is an enlarged cross-sectional view of the heater unit B using the heating mechanism 28 of an electron bombardment heating method.

As illustrated in FIG. 6, the heater unit B using the heating mechanism 28 of the electron bombardment heating method includes a conductive heated portion 131 provided to an inner wall 103 serving as a ceiling of a second chamber 23 of the vacuum chamber D. Inside the inner wall 103, water cooling flow channels 19 for a water cooling mechanism are provided to cool down the inner wall 103, as described above. The conductive heated portion 131 includes a bottom plate 131a and a surrounding wall 131b, which compose a heating container 104 together with the inner wall 103 serving as an upper lid, the heating container 104 housing parts of the heater unit B, such as the heating mechanism 28.

The inside of the heating container 104 is connected to an exhaust system 43 (see FIGS. 1 to 3). With the exhaust system 43, the heating container 104 can be evacuated independently of the space excluding the heating container 104 in the vacuum chamber D. In the state where the heating container 104 is evacuated to a specified degree of vacuum using the exhaust system 43, a filament 132 described later heats the substrate opposed face 2.

The bottom plate 131a and the surrounding wall 131b of the conductive heated portion 131, which are part of the heating container 104, are coated with fine carbon such as pyrolytic carbon or the like obtained by CVD, for example. Specifically, a coating film of fine carbon such as pyrolytic carbon is formed on at least one of the two surfaces, the surface (inside surface) on the heating mechanism 28 side and the surface (outside surface) serving as the substrate opposed face 2 of the bottom plate 131a. In addition, a coating film of fine carbon such as pyrolytic carbon is formed on at least one of the two surfaces, the surface (inside surface) on the heating mechanism 28 side of the surrounding wall 131b and the surface (outside surface) on the surrounding wall side of the vacuum chamber D. As described above, the coating film of fine carbon is formed on the inner surface and the outer surface of the conductive heated portion 131.

Moreover, the coating film described above formed on each outer surface of the bottom plate 131a and the surrounding wall 131b prevents or suppresses contamination of the semiconductor substrate 3 caused by the gas generated from the material of the conductive heated portion 131 and the conductive heated portion 131.

The conductive heated portion 131 includes the substrate opposed face 2 on the bottom plate 131a thereof. In other words, the substrate opposed face 2 is the face opposed in parallel to the substrate placement face of the substrate stage 1, among the faces of the conductive heated portion 131, facing the space where the substrate is subject to the treatment. For heating the semiconductor substrate 3, the substrate opposed face 2 is heated by thermal electrons from the filament 132 and serves as a radiation surface. The radiant heat from the substrate opposed face 2 heats the semiconductor substrate 3.

As illustrated in FIGS. 1 to 3, when the substrate holder unit A is lifted down, and the substrate stage 1 and the substrate opposed face 2 of the heater unit B are parted, the shutter apparatus C moves a shutter 17 in and out from between the substrate stage 1 and the substrate opposed face 2. The shutter apparatus C includes a shutter driving apparatus 18 to move the shutter 17 in and out.

As illustrated in FIGS. 1 and 3, when the substrate holder unit A is lifted down, and the substrate stage 1 and the substrate opposed face 2 are parted, the shutter 17 moves in between the substrate stage 1 and the substrate opposed face 2 to block the heat from being radiated from the substrate opposed face 2 into the substrate stage 1 side.

The vacuum chamber D is an enclosure made of aluminum alloy or the like. The water cooling flow channels 19 for the water cooling mechanism are provided inside the walls of the vacuum chamber D. By letting cooling water flow in the water cooling flow channels 19, it is possible to prevent the temperature of the enclosure of the vacuum chamber D from rising excessively. In addition, the vacuum chamber D includes a slit valve (gate valve) 20 for loading/unloading to open and close a loading/unloading port in loading or unloading the semiconductor substrate 3. In addition, the vacuum chamber D also includes a main valve (gate valve) 50 for exhaust to open and close an exhaust port connected the exhaust system to evacuate the inside to a vacuum atmosphere.

The vacuum chamber D includes a first chamber 22 located at the lower side and a second chamber 23 continuing from the first chamber 22 to the upper direction. The heater unit B is provided in the second chamber 23 located at the upper side with the substrate opposed face 2 facing downward. The first chamber 22 includes a first section 22a on the upper side of which the second chamber 23 continues, and a second section 22b which continues from a lateral side of the first section 22a. The shutter apparatus C is provided between the first section 22a and the second section 22b.

The substrate holder unit A can be lifted up to the second chamber 23 and lifted down to the first section 22a of the first chamber 22 by the lifting apparatus E. As illustrated in FIG. 2, when the substrate holder unit A is at the lift-up position where the heat treatment is performed, the substrate stage 1 and the substrate opposed face 2 of the heater unit B are brought close to each other in the state the cooling panel 6 portion occludes the opening between the first section 22a of the first chamber 22 and the second chamber 23. By heating the semiconductor substrate 3 in this state, the heat generated in the second chamber 23 is less prone to leak into the first chamber 22 therebelow. As a result, the cooling following the heating can be performed rapidly after the substrate holder unit A is lifted down to the first section 22a of the first chamber 22. Meanwhile, it is preferable that a mirror finish be applied to the inner surfaces of the vacuum chamber D, especially, the inner surfaces of the second chamber 23 so that the heating efficiency can be improved.

Moreover, the vacuum chamber D includes a gas inlet 51 provided on a side wall of the second section 22b of the first chamber 22 for introducing gas. The gas inlet 51 is connected to a gas introduction system 52, which is means for introducing the gas. The gas introduction system 52 includes a gas supply source 54 connected to the gas inlet 51 through a pipe 53, as well as a purifier 55, a valve 56, a mass flow controller (MFC) 57, and a valve 58 that are inserted midway in the pipe from the gas inlet 51 side in this order. The purifier 55 may or may not be there.

The gas supply source 54 supplies inert gas introduced into the vacuum chamber D. Ar gas and the like can be cited as the inert gas. Note that although the gas introduced into the vacuum chamber D is not limited to inert gas, a gas having a low reactivity is preferable, and an inert gas such as Ar gas or krypton (Kr) gas is far preferable. The purifier 55 removes impurities from the inert gas passing therethrough. The MFC 57 enables the inert gas to be supplied into the vacuum chamber D at a specified flow rate.

The control apparatus 60 includes CPU (not illustrated) that performs processing such as various calculation, control, and discrimination. In addition, the control apparatus 60 includes ROM (not illustrated) and the like that store various control programs and the like executed by CPU. Moreover, the control apparatus 60 includes RAM (not illustrated) and the like that temporarily store the data under CPU's processing, input data, and the like. The control apparatus 60 controls operation of each part of the heat treatment apparatus 100 and performs the heat treatment of the semiconductor substrate 3.

(Substrate Processing System)

Figure 7:
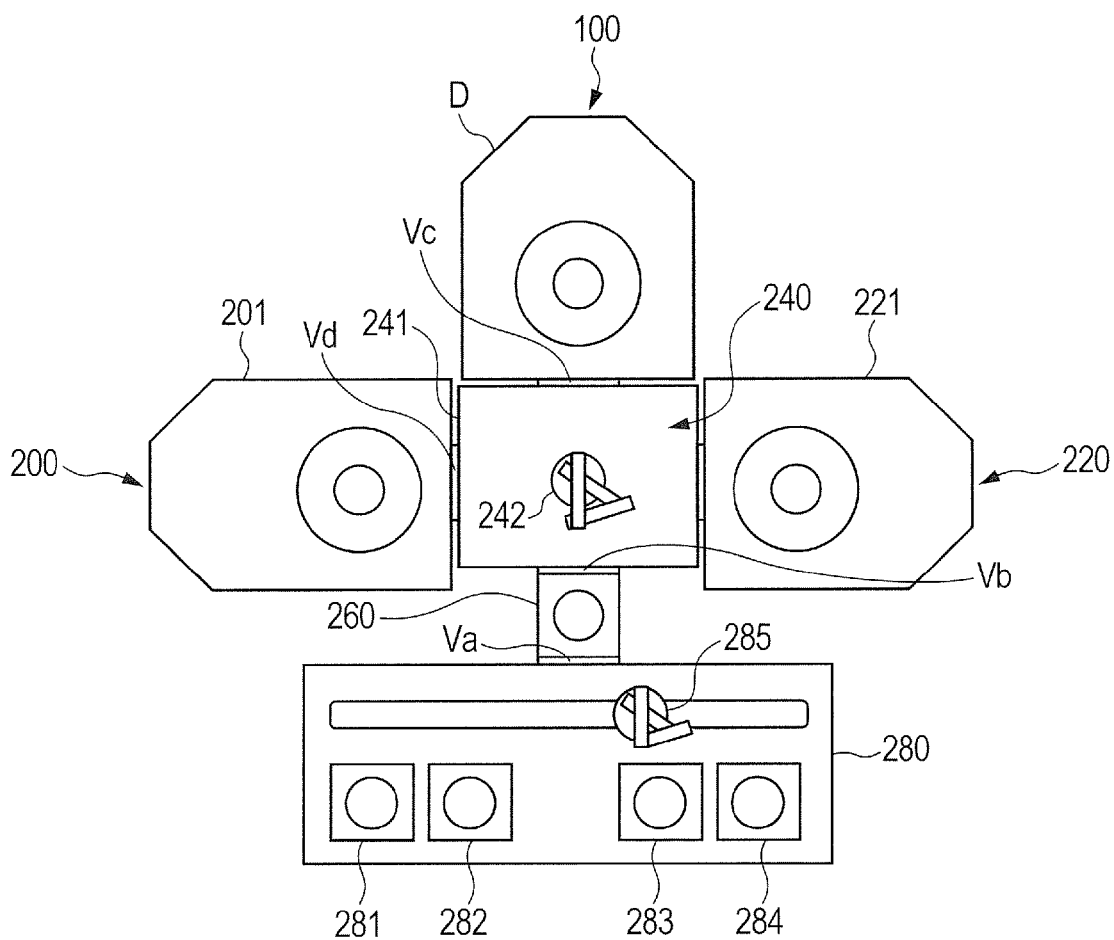
FIG. 7 is a schematic cross-sectional view illustrating a substrate processing system in which the heat treatment apparatus according to the embodiment of the present invention is integrated.

Using FIG. 7, descriptions are provided for an example of a substrate processing system in which the heat treatment apparatus 100 according to the embodiment described above is integrated.

As illustrated in FIG. 7, the substrate processing system includes the heat treatment apparatus 100 and a substrate transfer apparatus 240. In addition, the substrate processing system includes a load lock chamber 260 in which the semiconductor substrate 3 after treatment or before treatment is set and a substrate mounting chamber 280 that stores the semiconductor substrate 3 after treatment or before treatment.

The vacuum chamber D of the heat treatment apparatus 100, the substrate transfer apparatus 240, and the load lock chamber 260 are connected such that each chamber of the apparatuses can be isolated from the others by a slit valve. Note that in FIG. 7 illustrates each slit valve between the apparatuses for later explanation. Specifically, FIG. 7 illustrates a slit valve Va between the substrate mounting chamber 280 and the load lock chamber 260, a slit valve Vb between the load lock chamber 260 and a transfer chamber 241, and a slit valve Vc between the transfer chamber 241 and the vacuum chamber D.

The transfer chamber 241 of the substrate transfer apparatus 240 includes a transfer robot 242 and the like provided inside thereof, which is transfer means for transferring the semiconductor substrate 3. This enables the semiconductor substrate 3 to be loaded into and unloaded from the chamber of each apparatus.

The load lock chamber 260 is provided between the transfer chamber 241 serving as a substrate transfer chamber and the substrate mounting chamber 280. The semiconductor substrate 3 after treatment is loaded from the transfer chamber 241 and mounted in the load lock chamber 260 by the transfer robot 242. The semiconductor substrate 3 before treatment is transferred from the substrate mounting chamber 280, and then loaded and mounted in the load lock chamber 260.

Cassettes 281 to 284 that store the semiconductor substrate 3 can be mounted in the substrate mounting chamber 280. A transfer robot 285, which is transfer means for transferring the semiconductor substrate 3, and the like are provided in the substrate mounting chamber 280. In addition, an aligner (not illustrated) may be provided in the substrate mounting chamber 280 for aligning an orientation flat, a notch, and the substrate center of the semiconductor substrate 3. The transfer robot 285 loads the semiconductor substrate 3 before treatment from one of the cassettes 281 to 284 into the load lock chamber 260. The transfer robot 285 also unloads the semiconductor substrate 3 after treatment from the inside of the load lock chamber 260 into a specified cassette of the cassettes 281 to 284.

The load lock chamber 260 and the transfer chamber 241 each includes an exhaust system (not illustrated) provided for evacuating each chamber. The load lock chamber 260 and the transfer chamber 241 each also includes a gas introduction system (not illustrated) provided for introducing gas into each chamber, such as Ar gas. Note that the exhaust system 47 and the gas introduction system 52 of the vacuum chamber D are as described before. The control apparatus 60 described above is configured to be capable of controlling these exhaust systems evacuating the chambers and the gas introduction systems introducing gas into the chambers. The control apparatus 60 is also configured to be capable of controlling operations of the transfer robots 242 and 285.

(Heat Treatment Method for Semiconductor Substrate)

Figure 8A:
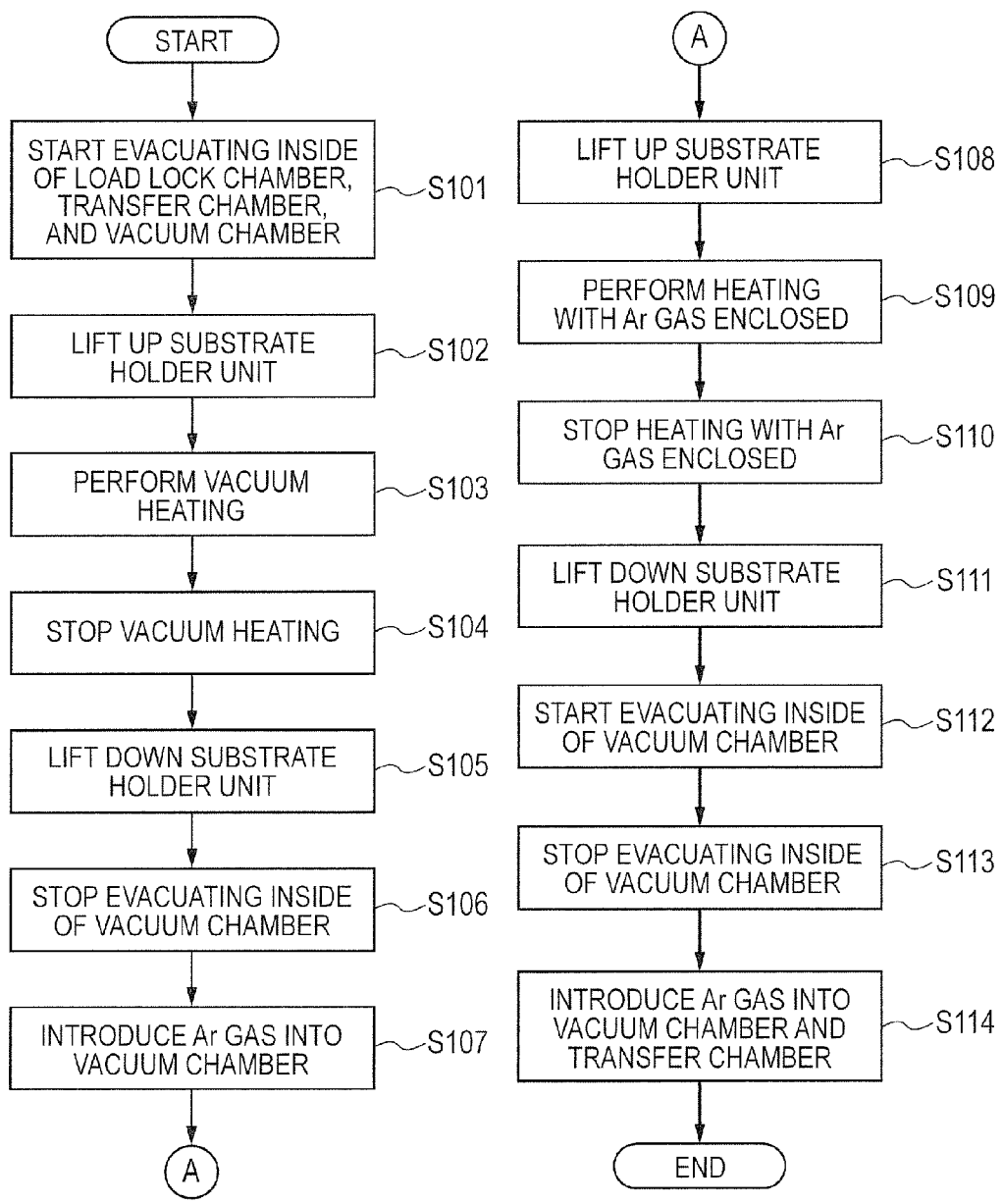
FIG. 8A is a flowchart illustrating prior preparation of a heat treatment method for a semiconductor substrate, according to the embodiment of the present invention.
Figure 8B:
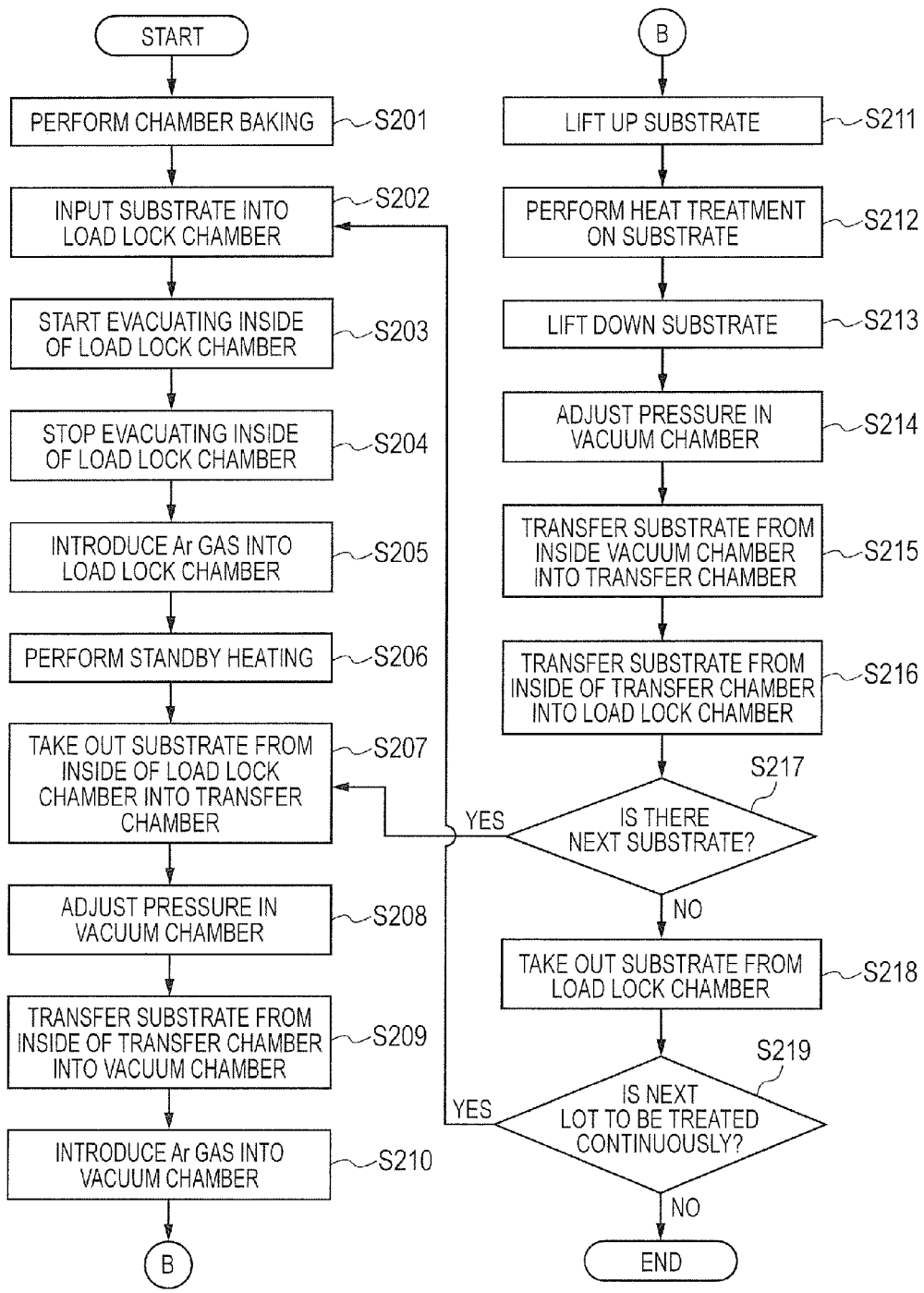
FIG. 8B is a flowchart illustrating the heat treatment method for a semiconductor substrate, according to the embodiment of the present invention.

Next, descriptions are provided for a heat treatment method for a semiconductor substrate, according to the embodiment using the heat treatment apparatus 100 in the substrate processing system illustrated in FIG. 7 described above, using FIGS. 8A and 8B. FIG. 8A is a flowchart illustrating prior preparation of the heat treatment method for a semiconductor substrate, according to the embodiment. FIG. 8B is a flowchart illustrating the heat treatment method for a semiconductor substrate, according to the embodiment.

In the heat treatment method for a semiconductor substrate, according the embodiment, the heat treatment is performed on the semiconductor substrate 3 in the vacuum chamber D with Ar gas sealed at a pressure exceeding the pressure in the molecular flow region. Note that when the heat treatment is performed on the semiconductor substrate 3, operation of each part of the heat treatment apparatus 100 is controlled by the control apparatus 60. For example, the exhaust system 47 evacuating the vacuum chamber D, the gas introduction system 52 introducing Ar gas into the vacuum chamber D, and other operations are controlled by the control apparatus 60.

Note that the state where the gas is sealed includes not only the state where introduction and exhausting of the gas into and out of the vacuum chamber D serving as the treatment chamber are not being performed at all, but also the state where the Ar gas existing on the surface of the semiconductor substrate 3 is kept to the extent that the Ar gas can inhibit release of the silicon. In other words, the state where the gas is sealed includes the case where the gas is being exhausted very slowly from the vacuum chamber D. Specifically, the state where the gas is sealed includes the state where the gas is being exhausted at a rate of around 0.1% of the capacity of the vacuum chamber D every five minutes and the state where the gas is being exhausted at a rate lower than this rate.

Before the heat treatment method for a semiconductor substrate according to the embodiment is performed, prior preparation (conditioning) is performed for the purpose of performing degassing treatment on members in the vacuum chamber D, and the like. Hereinafter, the prior preparation is described using FIG. 8A.

First, the insides of the load lock chamber 260, the transfer chamber 241, and the vacuum chamber D are evacuated to a high vacuum of $10^{-3}$ Pa or lower, for example (step S101).

Then, in the state where the slit valve Vc is closed, the substrate holder unit A is lifted up to a heating position (step S102), and vacuum heating is performed with the heater unit B (step S103). Heating temperature of this vacuum heating is, for example, 1500° C. or higher, specifically 1900° C. as a substrate equivalent temperature, for example. The substrate equivalent temperature is a temperature of the substrate which is assumed when the substrate is placed on the substrate holder unit.

Then, heating with the heater unit B is stopped to stop the vacuum heating (step S104), the substrate holder unit A is lifted down to the transfer position (step S105). After that, evacuating inside of the vacuum chamber D is stopped (step S106). Note that instead of stopping heating, only decreasing the heating temperature by decreasing the power of the heating mechanism 28 of the heater unit B would work.

Then, the valves 56 and 58 of the gas introduction system 52 are opened. By doing so, Ar gas in the gas supply source 54 is introduced through the pipe 53 into the vacuum chamber D from the gas inlet 51 (step S107). The pressure of the Ar gas introduced into the vacuum chamber D in this way is from 10 to 100 kPa, for example, and in this embodiment, the pressure of the Ar gas introduced is 75 kPa. After the Ar gas is introduced, the valves 56 and 58 are closed so that the Ar gas is sealed in the vacuum chamber D.

Note that step S106 and step S107 do not have to be performed in the order described above. Step S106 and step S107 may be performed in any order as long as the state where the Ar gas is sealed is obtained eventually.

Then, in the state where Ar is sealed in the vacuum chamber D, the substrate holder unit A is lifted up to the heat treatment position (step S108), and heating is performed with the heater unit B (step S109). The heating temperature in the state where the Ar gas is sealed is, for example, 1500° C. or higher, specifically, 1900° C. as a substrate equivalent temperature, for example.

Then, heating with the heater unit B is stopped to stop heating with the Ar gas sealed (step S110). Note that instead of stopping heating, only decreasing the heating temperature by decreasing power of the heating mechanism 28 of the heater unit B would work. Next, the substrate holder unit A is lifted down to the transfer position (step S111).

Then, evacuating the inside of the vacuum chamber D is started (step S112). Note that step S112 does not necessarily have to be performed after step S110, and step S110 may be performed after step S112. For evacuating the inside of the vacuum chamber D, a dry pump 49 and a turbomolecular pump 48 as necessary of the exhaust system 47 are used to evacuate the inside of the vacuum chamber D to a specified pressure. For example, the pressure in the vacuum chamber D is from $10^{-4}$ Pa to $10^{-3}$ Pa. With this, the partial pressure of $H_2O$ in the vacuum chamber D is from $10^{-5}$ Pa to $10^{-4}$ Pa, for example. By reducing the partial pressure of $H_2O$ in this way, the reaction probability between substrate material of the semiconductor substrate 3, such as SiC, and residual water can be drastically reduced, and the etching reaction can be suppressed, even in a high temperature. As a result, for the semiconductor substrate 3 after the heat treatment, high electrical activation can be achieved easily while a high surface flatness is kept.

Then, evacuating the inside of the vacuum chamber D is stopped (step S113).

Then, Ar gas is introduced into each of the vacuum chamber D and the transfer chamber 241 (step S114). Each pressure of the introduced Ar gas is, for example, from 1 kPa to 10 kPa, specifically 1 kPa.

As described above, the prior preparation before the heat treatment method for a semiconductor substrate, according to the embodiment is performed is finished. Note that in the prior preparation, both the vacuum heating and the heating with Ar gas sealed do not necessarily have to be performed. For example, it is possible that the vacuum heating is performed, whereas the heating with Ar gas sealed is not performed.

After the prior preparation is performed as described above, the heat treatment method for a semiconductor substrate, according to the embodiment is performed. Hereinafter, the heat treatment method for a semiconductor substrate, according to the embodiment is described using FIG. 8B.

The semiconductor substrate 3 to be subjected to the heat treatment has a trench formed thereon. The semiconductor substrate 3 is, for example, a SiC film. In the embodiment, the heat treatment is performed to make rounded the sharp corners at the opening and the bottom of the trench formed on the semiconductor substrate 3.

First, before the semiconductor substrate 3 is inputted, chamber baking of the vacuum chamber D is performed with the heater unit B as necessary (step S201). The heating temperature of the chamber baking is, for example, 1500° C. or higher, specifically, 1900° C. as a substrate equivalent temperature, for example.

Then, after the load lock chamber 260 is vented, the slit valve Va is opened, and the semiconductor substrate 3 is inputted from the substrate mounting chamber 280 into the load lock chamber 260 (step S202). Note that the number of the semiconductor substrates 3 may be one, or two or more. After the semiconductor substrate 3 is inputted into the load lock chamber 260, the slit valve Va is closed.

Then, evacuating the inside of the load lock chamber 260 is started (step S203). After the inside of the load lock chamber 260 is evacuated to 50 Pa or lower, for example, the evacuating of the inside of the load lock chamber 260 is stopped (step S204).

Then, the Ar gas is introduced into the load lock chamber 260 (step S205). The pressure of the introduced Ar gas is, for example, from 100 Pa to 10 kPa, specifically, 1 kPa.

Then, heating is performed as standby heating with the heater unit B (step S206). The heating temperature of the standby heating is, for example, from 1000 to 2000° C., specifically 1200° C. as a radiation surface temperature of the heating mechanism 28 of the heater unit B.

Then, the slit valve Vb is opened, and the semiconductor substrate 3 is taken out from the inside of the load lock chamber 260 into the transfer chamber 241 using the transfer robot 242 (step S207). At this time, the pressure in the load lock chamber 260 and the pressure in the transfer chamber 241 are almost the same (see step S110 and step S205). After the semiconductor substrate 3 is taken out into the transfer chamber 241, the slit valve Vb is closed.

Then, the pressure in the vacuum chamber D is adjusted using the exhaust system 47 or the gas introduction system 52 (step S208). By doing so, the pressure of the Ar gas in the vacuum chamber D is set to, for example, 1 kPa to 100 kPa, specifically, 10 kPa.

Then, as illustrated in FIG. 1, a slit valve 20 (corresponding to the slit valve Vc illustrated in FIG. 7) is opened, and the semiconductor substrate 3 is transferred from the inside of the transfer chamber 241 into the vacuum chamber D (step S209). The semiconductor substrate 3 transferred into the vacuum chamber D is placed on the lift pins 8. At this time, the pressure in the transfer chamber 241 and the pressure in the vacuum chamber D are almost the same (see step S114 and step S208). Meanwhile, the shutter 17 has moved in between the substrate holder unit A and the substrate opposed face 2. After the semiconductor substrate 3 is transferred into the vacuum chamber D, the slit valve 20 (slit valve Vc) is closed.

Note that after the semiconductor substrate 3 is transferred into the vacuum chamber D, the inside of the vacuum chamber D may be evacuated. By doing so, it is possible to reduce impurities such as water existing in the vacuum chamber D at the time of the heat treatment, as in the case where the vacuum chamber D is evacuated at step S108 in the prior preparation.

Then, the valves 56 and 58 of the gas introduction system 52 are opened. Then, introducing the Ar gas into the vacuum chamber D is started. Through the pipe 53, the Ar gas in the gas supply source 54 is introduced from the gas inlet 51 into the vacuum chamber D (step S210). At this time, the flow rate of the Ar gas is controlled by the MFC 57 to be a specified flow rate as necessary. Meanwhile, the Ar gas is introduced into the vacuum chamber D after impurities are removed by the purifier 55.

As described above, by introducing the Ar gas from the gas introduction system 52, when the pressure in the vacuum chamber D reaches a specified pressure, the valves 56 and 58 are closed. By doing so, introducing the Ar gas into the vacuum chamber D is stopped. The pressure of the Ar gas in the vacuum chamber D when the Ar gas introduction is stopped is, for example, from 1 kPa to 100 kPa, specifically, 10 kPa, for example. In this way, the Ar gas is sealed in the vacuum chamber D. Here, by stopping introducing the Ar gas into the vacuum chamber D after stopping evacuating the inside of the vacuum chamber D, the pressure in the vacuum chamber D before the heat treatment can be adjusted easily.

Note that the pressure of the Ar gas in the vacuum chamber D can be set as appropriate depending on the heat treatment temperature of the semiconductor substrate. When the heat treatment temperature is higher, setting the pressure of the Ar gas to be higher makes it possible to form rounded shapes at the corners of the trench while suppressing sublimation of the material of the semiconductor substrate 3. For example, in the case where the heat treatment temperature of the semiconductor substrate 3 is between 1500° C. and 2000° C. inclusive, specifically 1600° C., the pressure of the Ar gas can be set to 10 kPa or higher.

After the Ar gas is sealed in the vacuum chamber D, the shutter 17 is moved back, and the substrate holder unit A is lifted up by the lifting apparatus E. After the substrate placement portion 7 in the substrate stage 1 of the rising substrate holder unit A scoops up the semiconductor substrate 3, the substrate holder unit A is lifted up more to the heat treatment position. In this way, the semiconductor substrate 3 is lifted up, and the substrate stage 1 of the substrate holder unit A and the substrate opposed face 2 of the heater unit B are brought closer as illustrated in FIGS. 2 and 5 (step S211). At this time, at least the semiconductor substrate 3 needs to be out of contact with the substrate opposed face 2. Although the substrate stage 1 may be in contact with the substrate opposed face 2, it is preferable that both the substrate stage 1 and the semiconductor substrate 3 on the substrate stage 1 be out of contact with the substrate opposed face 2. It is preferable that the interval between the substrate opposed face 2 and the semiconductor substrate 3 be from 1 to 25 mm, though it depends on the size of the substrate opposed face 2 and the semiconductor substrate 3, the heat treatment temperature, the output of the heating mechanism 28, and other factors.

In the embodiment, the heat treatment is performed on the semiconductor substrate 3 at the heat treatment position closer to the substrate opposed face 2 than the position where the semiconductor substrate 3 is transferred into the vacuum chamber D and placed on the lift pins 8, as described above. In other words, the heat treatment is performed in the state where the semiconductor substrate 3 and the substrate opposed face 2 are brought closer than the state where the semiconductor substrate 3 is transferred into the vacuum chamber D and placed (the transfer position). Because of this, the temperature in the vacuum chamber D does not have to be raised widely, and the heat treatment can be performed with a high efficiency. Note that although the semiconductor substrate 3 and the substrate opposed face 2 are brought closer by lifting up the substrate holder unit A in the embodiment, the semiconductor substrate 3 and the substrate opposed face 2 only need to be brought relatively closer. For example, the heat treatment apparatus 100 may be configured such that the substrate opposed face 2 and the semiconductor substrate 3 come closer by the heater unit B including the substrate opposed face 2 moving down.

Meanwhile, before the Ar gas is sealed in the vacuum chamber D, the semiconductor substrate 3 may be preheated to a preheating temperature lower than the heat treatment temperature. The preheating of the semiconductor substrate 3 can be performed with the heater unit B in the state where the substrate stage 1 of the substrate holder unit A and the substrate opposed face 2 of the heater unit B are brought closer as described above, or in the state before they are brought closer. The standby heating described above (see step S206) corresponds to the preheating. In the case where the semiconductor substrate 3 is a SiC substrate, the preheating temperature is set to, for example, 1700° C. or lower, specifically, 1200° C. Note that this temperature is a setting temperature of the heater unit B. It is because the probability of Si sublimation of a SiC substrate is low when the temperature is 1700° C. or lower. By preheating the semiconductor substrate 3 to the preheating temperature lower than the heat treatment temperature in this way, the treatment time can be reduced.

In addition, in order to reduce the treatment time, the Ar gas may be sealed in the vacuum chamber D by introducing the Ar gas into the vacuum chamber D and then stopping it while the heating mechanism 28 of the heater unit B is raising the temperature. As described above, the timing of enclosing the Ar gas in the vacuum chamber D is not limited to a specific timing. The timing of enclosing the Ar gas is not limited as long as the heat treatment of the semiconductor substrate 3 can be performed with the Ar gas sealed, and enclosing only needs to be completed by the time the temperature reaches the heat treatment temperature.

Then, heating to a high temperature is performed by raising the power of the heating mechanism 28 of the heater unit B in the state where the Ar gas is sealed in the vacuum chamber D as described above. In this way, the heat treatment is performed on the semiconductor substrate 3 with the radiant heat from the substrate opposed face 2 (step S212). The heat treatment temperature of the semiconductor substrate 3, which is the temperature when the semiconductor substrate 3 is subjected to the heat treatment, is, for example, from 1500° C. to 2000° C., more specifically, 1600° C. In the heat treatment, heating with the heating mechanism 28 is continued until the temperature of the substrate stage 1 measured by a temperature measurement instrument 16 reaches a specified heat treatment temperature. After the temperature reaches the specified heat treatment temperature, the temperature is kept until a specified heat treatment time has passed. The heat treatment time is, for example, from 1 minute to 30 minutes.

In the heat treatment method for a semiconductor substrate, according to the embodiment, the heat treatment is performed on the semiconductor substrate 3 with the Ar gas sealed in the vacuum chamber D, as described above. The pressure of the sealed Ar gas is a pressure exceeding the pressure in the molecular flow region, for example, from 1 kPa to 100 kPa, more specifically, 10 kPa. The pressure of the sealed Ar gas can be set as appropriate depending on the heat treatment temperature of the semiconductor substrate 3 as described above. For example, in the case where the heat treatment temperature is from 1500° C. to 1750° C., the pressure of the Ar gas can be set to 10 kPa or higher. For example, in the case where the heat treatment temperature is from higher than 1750° C. to 2000° C., the pressure of the Ar gas can be set to 50 kPa or higher.

When the heat treatment is performed in the atmosphere where the pressure of the Ar gas is high, at a pressure of the sealed Ar gas exceeding the pressure in the molecular flow region as described above, the probability of Si atoms, detaching around a surface of the SiC substrate, and Ar atoms colliding with each other increases. As a result, the vapor pressure of the Si atom can be raised locally around the surface of the SiC substrate. In addition, since the Ar gas is sealed in the vacuum chamber D, flow of the Ar gas on the surface of the SiC is suppressed. For this reason, Si atoms detaching from the surface of the SiC substrate because of heating are not exhausted but remain around the surface of the SiC substrate. As a result, the vapor pressure of the Si atom around the surface of the SiC substrate is saturated. Then, the detachment of Si atoms on the surface of the SiC substrate is suppressed, and only several layers of Si atoms at the surface of the SiC substrate detach. In addition, Si atoms remaining at the SiC surface move on the SiC surface because of energy given by heating. The Si atoms that moved at this time can take a more stable shape by making rounded the sharp corners at the opening and the bottom of the trench.

In addition, in the embodiment, the heat treatment is performed in the state where the semiconductor substrate 3 and the substrate opposed face 2 of the heater unit B are brought closer than the state where the semiconductor substrate 3 is transferred into the vacuum chamber D and placed. By performing the heat treatment in the state where the semiconductor substrate 3 and the substrate opposed face 2 are brought closer in this way, the detachment of Si atoms can be suppressed to minimum. As a result, it is possible to make rounded the sharp corners at the opening and the bottom of the trench without widening largely the opening width of the trench before treatment.

Note that as to the trench width of a trench MOSFET using a SiC substrate, it is said that the difference in dimension between before etching and after the treatment of making the corners rounded needs to be restrained within ±100 nm at the upper portion of the inside of the trench, in other words, around the opening of the trench, and preferably it is required to be restrained within ±50 nm. In the embodiment, as to the trench width, the difference in dimension between before etching and after the treatment of making the corners rounded can be restrained within ±50 nm, and more specifically, −35 nm of the difference in dimension can be achieved.

After the heat treatment is performed on the semiconductor substrate 3 as described above, the heating mechanism 28 of the heater unit B is turned off and natural cooling is started. In the case where there is another semiconductor substrate 3 to be treated continuously, the standby heating may be performed with the heater unit B. Along with the operation, the substrate holder unit A is lifted down to a specified precooling position by the lifting apparatus E, and the temperature is let down until the temperature of the substrate stage 1 measured with the temperature measurement instrument 16 reaches a specified temperature.

After that, in order to cool down the semiconductor substrate 3 without bringing the semiconductor substrate 3 in contact with the lift pins 8, the semiconductor substrate 3 is lifted down by further lowering the substrate holder unit A to a specified cooling position by the lifting apparatus E, as illustrated in FIG. 3 (step S213). Along with this operation, the shutter 17 including a cooling mechanism is moved in between the substrate stage 1 of the substrate holder unit A lifted down to the cooling position and the substrate opposed face 2 of the heater unit B to accelerate cooling. In this way, further cooling is performed at the cooling position until the temperature of the substrate stage 1 measured with the temperature measurement instrument 16 reaches a specified temperature.

Then, the substrate holder unit A is lifted down to the loading/unloading position. While the substrate holder unit A is lifted down from the cooling position to the loading/unloading position, the semiconductor substrate 3 is scooped on the lift pins 8 and becomes in the state where the semiconductor substrate 3 is easily taken out.

After the substrate holder unit A is lifted down to the loading/unloading position, the pressure in the vacuum chamber D is adjusted using the exhaust system 47 (step S214). By doing this, the pressure of the Ar gas in the vacuum chamber D is set to, for example, from 100 pa to 10 kPa, specifically, 1 kPa.

Then, the slit valve 20 (slit valve Vc) is opened, and the semiconductor substrate 3 is transferred from the inside of the vacuum chamber D into the transfer chamber 241 using the transfer robot 242 of the transfer chamber 241 (step S215). After the transfer, the slit valve 20 (slit valve Vc) is closed. In this way, the semiconductor substrate 3 in which the sharp corners at the opening and the bottom of the trench are made rounded is manufactured.

As described above, by setting in advance the pressures in the vacuum chamber D and the transfer chamber 241, the semiconductor substrate 3 can be transferred from the inside of the vacuum chamber D into the transfer chamber 241 immediately after the heat treatment for the semiconductor substrate 3. This reduces the treatment time including the transfer of the semiconductor substrate 3 from the inside of the vacuum chamber D. Meanwhile, since the pressures in the both chambers are the same at this time, it is possible to avoid flinging up particles due to a pressure difference between chambers, and the like, which may cause contamination of the semiconductor substrate 3 after the heat treatment.

Then, the slit valve Vb is opened, and the semiconductor substrate 3 transferred into the transfer chamber 241 is transferred from the inside of the transfer chamber 241 into the load lock chamber 260 (step S216).

Then, in the case where there is a next semiconductor substrate 3 to be heat treated in the load lock chamber 260 (YES at step S217), the process moves to step S207, and the treatment is continued on the next semiconductor substrate 3.

On the other hand, in the case where there is not a next semiconductor substrate 3 to be heat treated in the load lock chamber 260 (NO at step S217), the slit valve Vb is closed, and the load lock chamber 260 is vented. After that, the slit valve Va is opened, and the semiconductor substrate 3 after the heat treatment is taken out from the load lock chamber 260 (step S218).

In the case where the heat treatment is performed continuously on the next lot of the semiconductor substrates 3 (YES at step S219), the process moves to step S202, and the treatment is continued on the next lot of the semiconductor substrates 3.

On the other hand, in the case where the heat treatment is not performed continuously on the next lot of the semiconductor substrates 3 (NO at step S219), the slit valve Va is closed, and the process is completed.

As described above, according to the embodiment, since the heat treatment of the semiconductor substrate 3 is performed with the Ar gas sealed in the vacuum chamber D, it is possible to make rounded the sharp corners at the opening and the bottom of the trench, while suppressing the difference in dimension at the opening of the trench and improving productivity, without necessity of the expensive auxiliary equipment.

Note that the process flowcharts illustrated in FIGS. 8A and 8B described above are only examples, and the mode of evacuating the inside of the vacuum chamber D and introducing the Ar gas into the vacuum chamber D to achieve the state where the Ar gas is sealed in the vacuum chamber D is not limited to the one described above. In addition, the mode of evacuating the inside of each of the load lock chamber 260, the transfer chamber 241, and the vacuum chamber D and introducing the Ar gas into each chamber in transferring the semiconductor substrate 3 to be heat treated into the vacuum chamber D is also not limited to the one described above. In addition, the mode of evacuating the inside of each chamber and introducing the Ar gas into each chamber in transferring the semiconductor substrate 3 after the heat treatment from the inside of the vacuum chamber D into the load lock chamber 260 is also not limited to the one described above.

Meanwhile, in the case where the heat treatment is performed with the Ar gas sealed in the vacuum chamber D as described above, sublimated Si is not exhausted. For this reason, the sublimated Si is attached onto the inner walls of the vacuum chamber D. When the sublimated Si is accumulated on the inner walls of the vacuum chamber D, the reflection rate of the inner walls for the radiation changes. For this reason, even though the temperature of the heating mechanism 28 of the heater unit B is the same, the temperature of the semiconductor substrate 3 at the heat treatment sometimes changes because of the repeated heat treatments. In the case like this, the temperature of the semiconductor substrate 3 is detected with the temperature measurement instrument 16 or the like, and output of the heating mechanism 28 is changed by the control apparatus 60 in accordance with the detection result. This makes it possible to adjust the temperature of the semiconductor substrate 3 at the time of the heat treatment, and improve the reproducibility of the heat treatment.

(Semiconductor Apparatus and Manufacturing Method Thereof)

The heat treatment method for a semiconductor substrate, according to the embodiment described above is applicable to making rounded the sharp corners at the opening and the bottom of a trench when semiconductor apparatuses are manufactured using semiconductor substrates having a trench. In addition, the heat treatment method for a semiconductor substrate, according to the embodiment described above is applicable to activation annealing of impurities as well as making rounded the sharp corners at the opening and the bottom of the trench, when semiconductor apparatuses are manufactured using semiconductor substrates having a trench into which impurities are doped. Hereinafter, descriptions are provided for an specific example of a semiconductor apparatus which is manufactured applying the heat treatment method according to the embodiment.

Figure 9:
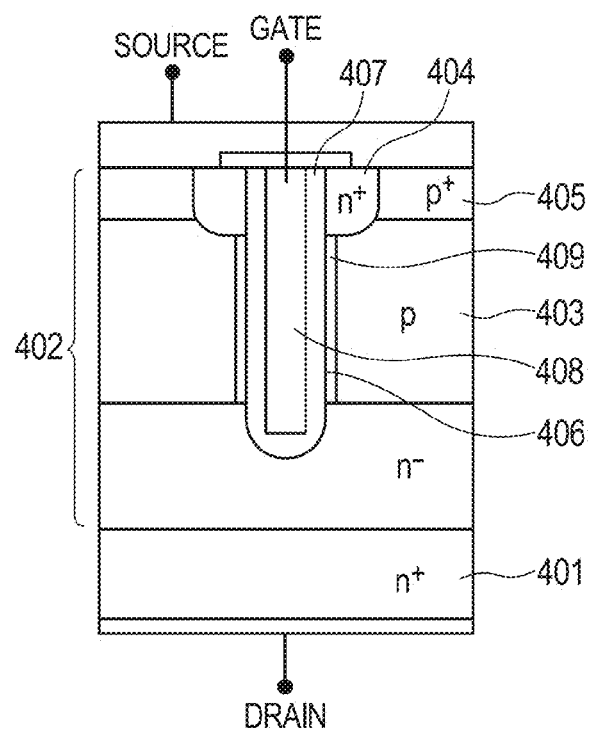
FIG. 9 is a schematic cross-sectional view illustrating an example of a trench MOSFET manufactured using a manufacturing method for semiconductor apparatuses, according to the embodiment of the present invention.

FIG. 9 illustrates a trench MOSFET manufactured using a SiC substrate. As illustrated, $n^-$ type SiC film (drift layer) 402 is formed on the $n^+$ type SiC substrate 401 by an epitaxial growth method.

Then, a trench 406 is formed in the drift layer 402 by a dry etching method using $SiO_2$ or the like as a etching mask (not illustrated). After the trench 406 is formed, the etching mask is removed by hydrofluoric acid cleaning or the like.

Then, using the heat treatment method for a semiconductor substrate, according to the embodiment, the sharp corners at the opening and the bottom of the trench formed by the dry etching method are made rounded.

Then, $SiO_2$ (not illustrated) is embedded into the opening of the trench 406 using a plasma CVD method or the like, and an injection suppressing layer (not illustrated) is formed for preventing impurities from being injected into a portion where the injection is unnecessary.

A P type well layer (impurity region) 403 is formed by ion-implanting p type impurities, for example, aluminum into the $n^-$ type SiC film 402 using $SiO_2$ or the like as a mask (not illustrated).

Then, after the $SiO_2$ for the implantation mask is removed by hydrofluoric acid treatment or the like, an $n^+$ type contact layer (impurity region) 404, which is a concentrated $n^+$ type impurity layer, is formed by ion-implanting n type impurities, for example, phosphorus into the p type well layer 403 using $SiO_2$ or the like as a mask (not illustrated).

Then, the $SiO_2$ for the implantation mask is removed by hydrofluoric acid treatment or the like. After that, a $P^+$ type contact layer (impurity region) 405 which is a concentrated $p^+$ type impurity layer is formed by ion-implanting p type impurities, for example, aluminum so as to adjoin to the outside of the $n^+$ type contact layer 404 of the p type well layer 403, using $SiO_2$ or the like as a mask (not illustrated).

Then, impurities in each of the impurity regions 403, 404, and 405 are activated by performing the heat treatment on the semiconductor substrate.

Then, in order to remove an altered layer formed on a surface of the substrate, about 50 nm of a sacrificial oxide layer (not illustrated) is formed by performing oxidation treatment in an oxygen atmosphere roughly at 1100° C. for 30 minutes in a vertical furnace, for example.

Then, after a clean SiC surface is exposed by washing away the sacrificial oxide layer with hydrofluoric acid, a silicon oxide film 407 serving as a gate insulation film is formed on the side of the trench 406. After the silicon oxide film 407 is formed, the trench 406 is filled with a polysilicon film. Next, a gate electrode 408 made of polysilicon is formed by patterning the polysilicon film.

Then, electrodes, interlayer insulation films, interconnections, and the like (not illustrated) are formed to manufacture the trench n type MOSFET. In the trench n type MOSFET thus manufactured, the bottom side of the SiC substrate 401 functions as a drain. The $n^+$ type contact layer 404 formed on the periphery of the silicon oxide film 407 functions as a source. A channel 409 is formed between the p type well layer 403 and the silicon oxide film 407 by applying a voltage to the gate electrode 408, and carriers move along the trench 406 in the direction perpendicular to the substrate surface.

Note that the present invention is not limited to the above embodiment, and various modifications can be made.

For example, in the above embodiment, after the sharp corners at the opening and the bottom of the trench are made rounded, impurities are ion-implanted, and the impurities are activated by the heat treatment. However, the process of making rounded the sharp corners at the opening and the bottom of the trench and the activation of the impurities may be performed at the same time in the heat treatment. In addition, in the embodiment, descriptions were provided for the process of making rounded the sharp corners at the opening and the bottom of the trench by performing the heat treatment on the SiC substrate with the trench formed thereon. However, the invention is not limited to this case and applicable to a semiconductor substrate having a concave portion formed thereon. Moreover, if the heat treatment of the embodiment is applied to a semiconductor substrate having a through hole formed therein, a sharp corner at the opening of the through hole can be made rounded.

In addition, in this embodiment, descriptions were provided for the case where the Ar gas is sealed in the vacuum chamber D as a main example. However, as described above, gas sealed in the vacuum chamber D is not limited to Ar gas. Since gas sealed in the vacuum chamber D is only required to have no reactivity or a low reactivity to the material of the semiconductor substrate to be heat treated, another inert gas may be used.

EXAMPLE

Example 1

In an example 1, a substrate having a SiC crystal layer formed by the epitaxial growth as a surface layer was prepared as a SiC substrate. Using a $SiO_2$ mask formed on this SiC surface layer, a trench was formed by a dry etching method on the SiC, and the $SiO_2$ mask was removed by hydrofluoric acid cleaning.

First, the chambers such as the load lock chamber 260, the transfer chamber 241, and the vacuum chamber D as the process chamber were evacuated to a high vacuum of $10^{-3}$ Pa or lower in advance. In addition, degassing was performed thoroughly for the heating mechanism 28, the chamber, the substrate holder unit A, and other components, by heating the heating mechanism 28 to 1500° C. or higher while evacuating the vacuum chamber D with the turbomolecular pump 48.

After degassing was completed, Ar gas was fed into the vacuum chamber D and the transfer chamber 241 until the pressure reached 1 kPa, while the turbomolecular pump was stopped, or a main valve for exhaust was closed in the vacuum chamber D and the transfer chamber 241. Then, the Ar gas was sealed in the vacuum chamber D and the transfer chamber 241 by closing the valve for introducing the Ar gas.

In the state where the Ar gas was sealed as described above, the substrate holder unit A of the vacuum chamber D was lifted down to the loading/unloading position for transferring a substrate. Then, the shutter 17 was moved in between the substrate holder unit A and the heater unit B, and heating is performed in advance until the temperature of the radiation surface of the heating mechanism 28 of the heater unit B reached 1200° C.

Then, the load lock chamber 260 was vented with Ar gas or nitrogen ($N_2$) gas, and the SiC substrate described above was set into the load lock chamber 260. Then, after the inside of the load lock chamber 260 is evacuated to about 10 Pa with the dry pump, the exhaust valve was closed. After that, Ar gas was fed into the load lock chamber 260 until the pressure reached 1 kPa, and the Ar gas was sealed in the load lock chamber 260.

Then, the slit valves Vb and Vc between the chambers were opened, and the SiC substrate in the load lock chamber 260 was transferred into the vacuum chamber D via the transfer robot 242 of the transfer chamber 241. Since the load lock chamber 260, the transfer chamber 241, and the vacuum chamber D had the same pressure at this time, flinging up particles or a position error of the SiC substrate did not occur when the slit valves were opened for transfer. After the SiC substrate was transferred, the slit valves Vb and Vc of the vacuum chamber D for transferring in and out were closed.

Next, Ar gas was introduced into the vacuum chamber D until the pressure reached 10 kPa, and then the gas introduction valve was closed to hermetically enclose the Ar gas. The shutter 17 was moved out from between the substrate holder unit A and the heater unit B, and the substrate holder unit A was lifted up to the heat treatment position. Then, the SiC substrate was heated up with the heating mechanism 28 of the heater unit B until the temperature of the SiC substrate reached 1600° C., and kept at the temperature for five minutes.

After the heat treatment for the SiC substrate was completed in this way, the substrate holder unit A was lifted down to the cooling position and cooled down until the temperature of the SiC substrate reached around 1400° C. After that, the substrate holder unit A was lifted down to the loading/unloading position, and the shutter 17 was moved in between the substrate holder unit A and the heater unit B. During this cooling time, the vacuum chamber D was evacuated with the exhaust system 47 so that the pressure reached 1 kPa.

Next, the slit valves Vb and Vc were opened, and the SiC substrate was transferred into the load lock chamber 260 via the transfer robot 242 of the transfer chamber 241. Next, the load lock chamber 260 was vented, and the SiC substrate was taken out of the load lock chamber 260. The heat treatment for making rounded the corners of the trench of the SiC substrate was performed in this way.

Figure 10:
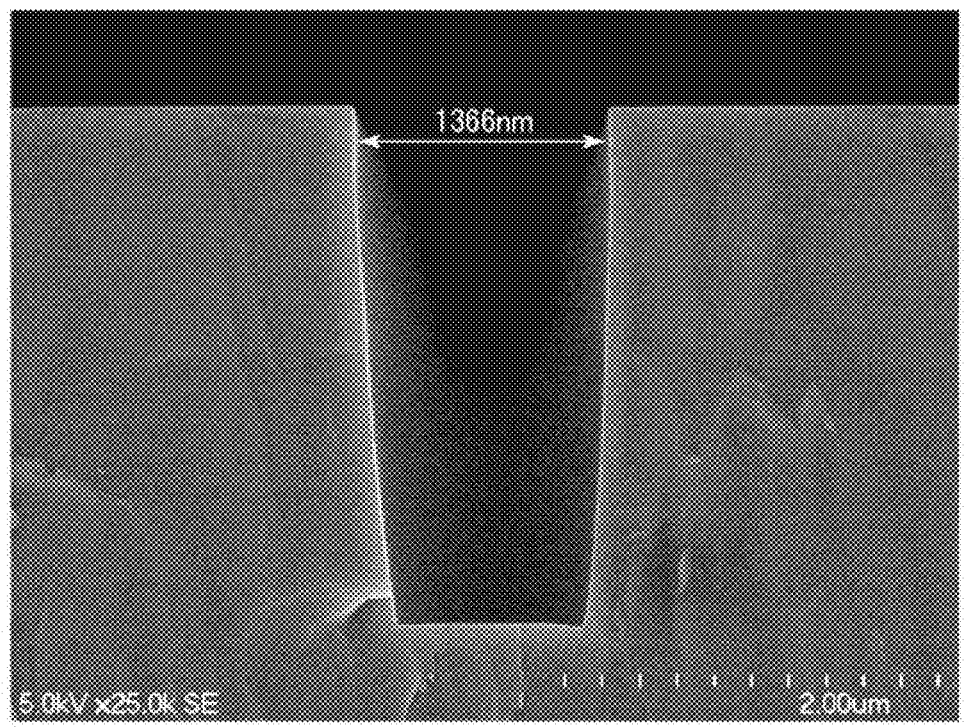
FIG. 10 is part of a cross-sectional view of a semiconductor substrate with a trench before heat treatment, used for the embodiment of the present invention.
Figure 11:
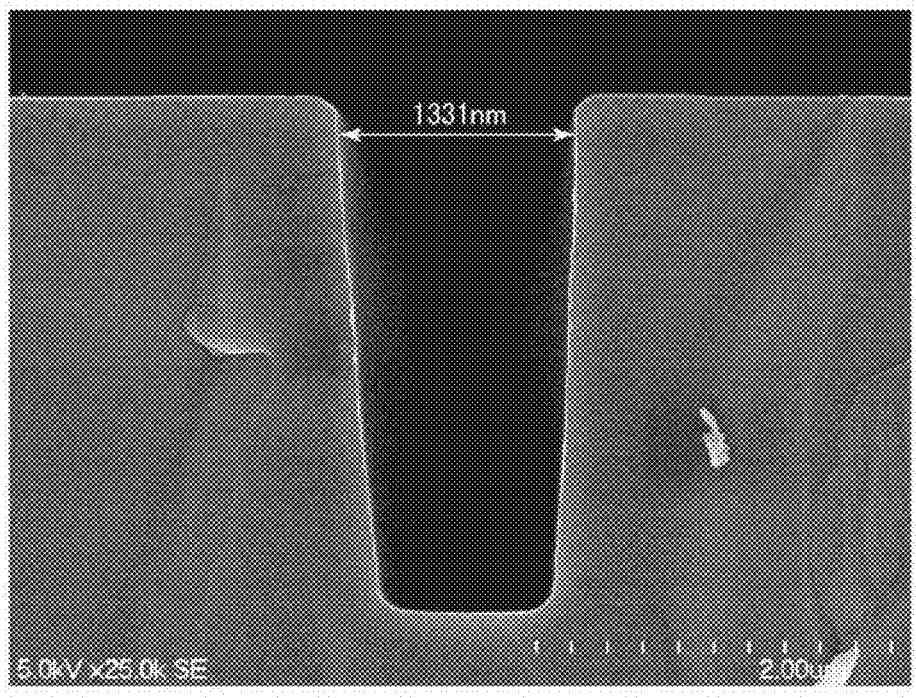
FIG. 11 is part of a cross-sectional view (part 1) of a trench after heat treatment, used for the embodiment of the present invention.

Before and after the above heat treatment, the shapes of the corners at the opening and the corners at the bottom of the trench, and the widths of a upper portion, a middle portion, and a bottom portion inside the trench were measured by examining a cross section of the trench of the SiC substrate with a scanning electron microscope (SEM). As illustrated in FIG. 10 and Table 1, as to the shape of the trench before the heat treatment, the corners at the opening and the corners at the bottom of the trench were sharp, and the widths of the upper portion, the middle portion, and the bottom portion inside the trench were 1366 nm, 1286 nm, and 1059 nm, respectively. As FIG. 11 and Table 1 illustrate the shape of the trench after the treatment according to this example, the corners at the opening and the corners at the bottom of the trench are rounded, and the widths of the upper portion, the middle portion, and the bottom portion inside the trench are 1331 nm, 1199 nm, and 1036 nm, respectively, and change of the widths of the trench is small. Since the corners at the opening and the corners at the bottom of the trench are rounded and change of the width of the upper portion of the trench is −35 nm, it is understood that the shape of the trench was well controlled in the treatment. Note that as the widths of the upper portion and the bottom portion inside the trench, the widths between the tangential lines of the side walls of the trench were measured.

Example 2

In an example 2, a SiC substrate having a trench was prepared in the same way as in the example 1. The example 2 is the process in which the keeping time of the SiC substrate at 1600° C. is changed to 30 minutes compared to the example 1.

Figure 12:
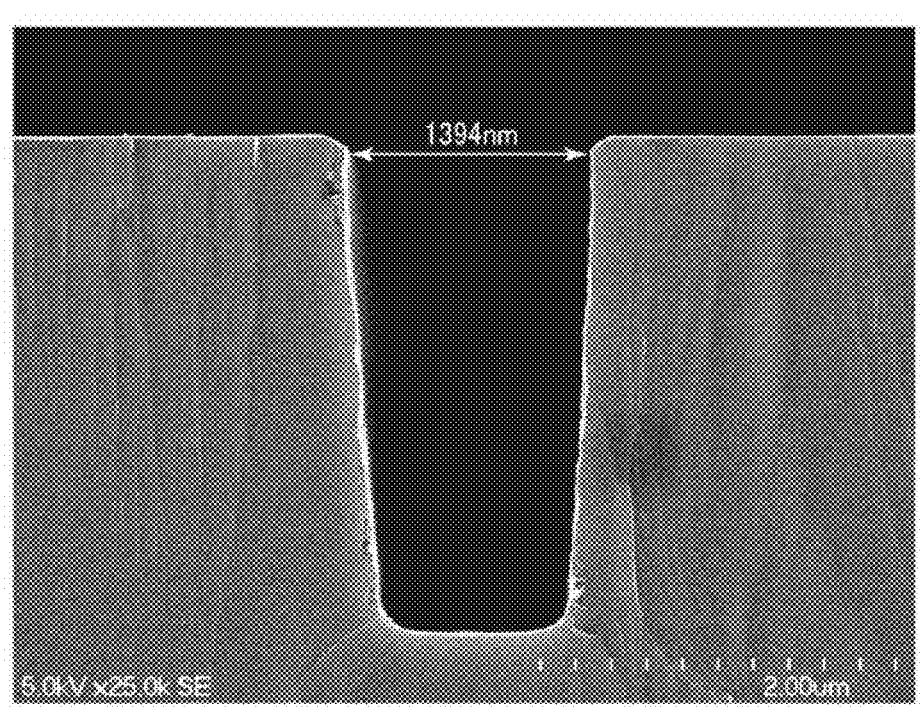
FIG. 12 is part of a cross-sectional view (part 2) of a trench after heat treatment, used for the embodiment of the present invention.

Before and after the above heat treatment, the shapes of the corners at the opening and the corners at the bottom of the trench and the widths of a upper portion, a middle portion, and a bottom portion inside the trench were measured by examining a cross section of the trench of the SiC substrate with the scanning electron microscope. As illustrated in FIG. 10 and Table 1, as to the shape of the trench before the heat treatment, the corners at the opening and the corners at the bottom of the trench were sharp, and the widths of the upper portion, the middle portion, and the bottom portion inside the trench were 1366 nm, 1286 nm, and 1059 nm, respectively. As FIG. 12 and Table 1 illustrate the shape of the trench after the treatment according to this example, the corners at the opening and the corners at the bottom of the trench are rounded, and the widths of the upper portion, the middle portion, and the bottom portion inside the trench are 1394 nm, 1251 nm, and 1076 nm, respectively and change of the widths of the trench is small. Since the corners at the opening and the corners at the bottom of the trench are rounded and change of the width of the upper portion of the trench is +28 nm, it is understood that the shape of the trench was well controlled in the treatment.

Comparative Example 1

In a comparative example 1, a SiC substrate having a trench was prepared in the same way as in the example 1.

In the state where Ar gas was being flowed instead of being sealed unlike the example 1, and the pressure of the Ar gas in the vacuum chamber D was set to 10 kPa, the SiC substrate was subjected to the heat treatment at 1600° C. for 5 minutes.

Figure 13:
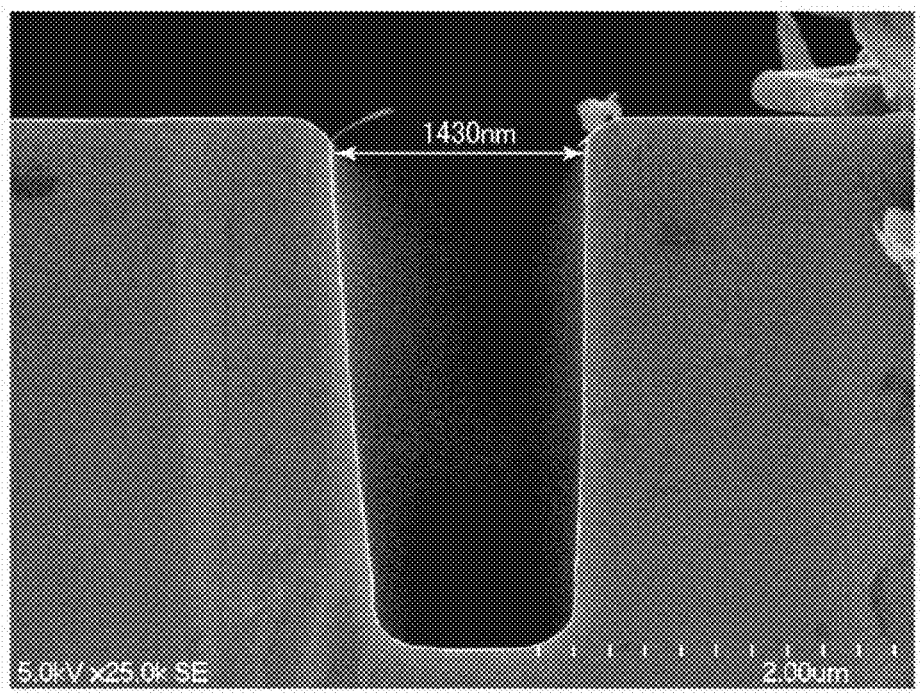
FIG. 13 is part of a cross-sectional view (part 1) of a trench after heat treatment, used for a comparative example to the present invention.

Before and after the above heat treatment, the shapes of the corners at the opening and the corners at the bottom of the trench and the widths of a upper portion, a middle portion, and a bottom portion inside the trench were measured by examining a cross section of the trench of the SiC substrate with the scanning electron microscope. As illustrated in FIG. 10, as to the shape of the trench before the heat treatment, the corners at the opening and the corners at the bottom of the trench were sharp, and the widths of the upper portion, the middle portion, and the bottom portion inside the trench were 1366 nm, 1286 nm, and 1059 nm, respectively. As FIG. 13 and Table 1 illustrate the shape of the trench after the treatment according to this example, the corners at the opening of the trench were deformed and receded, and the corners at the bottom of the trench were excessively rounded. The widths of the upper portion, the middle portion, and the bottom portion of the trench were 1430 nm, 1334 nm, and 1139 nm, respectively. The width of the trench widened in whole, and asperities appeared on the bottom surface and the side surfaces.

Comparative Example 2

In a comparative example 2, a SiC substrate having a trench was prepared in the same way as in the example 1.

In the state where the pressure of the Ar gas sealed in the vacuum chamber D was set to 100 Pa unlike the example 1, the SiC substrate was subjected to the heat treatment at 1600° C. for 5 minutes.

Figure 14:
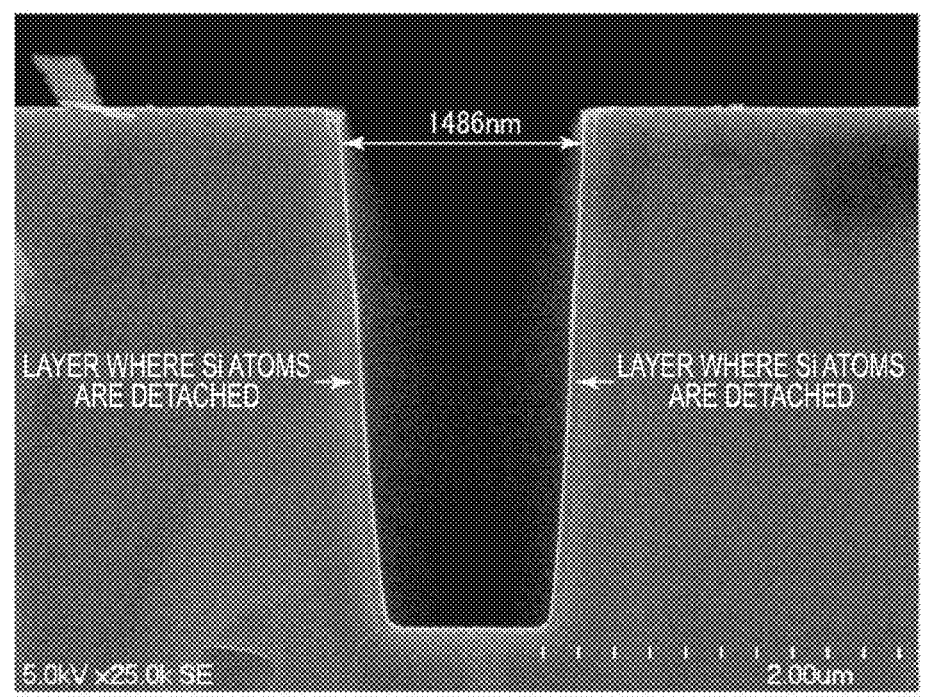
FIG. 14 is part of a cross-sectional view (part 2) of a trench after heat treatment, used for a comparative example to the embodiment of the present invention.

Before and after the above heat treatment, the shapes of the corners at the opening and the corners at the bottom of the trench and the widths of an upper portion, a middle portion, and a bottom portion inside the trench were measured by examining a cross section of the trench of the SiC substrate with the scanning electron microscope. As illustrated in FIG. 10, as to the shape of the trench before the heat treatment, the corners at the opening and the corners at the bottom of the trench were sharp, and the widths of the upper portion, the middle portion, and the bottom portion inside the trench were 1366 nm, 1286 nm, and 1059 nm, respectively. As FIG. 14 and Table 1 illustrates the shape of the trench after the treatment according to this example, the corners at the opening of the trench were still sharp. Although the corners of the bottom were rounded, the widths of the upper portion, the middle portion, and the bottom portion of the trench were 1486 nm, 1303 nm, and 1084 nm, respectively, and the width of the trench widened in whole. A layer where Si atoms were detached was found on the side surfaces of the trench.

TABLE 1

| | ITEM | | | | |
|---|---|---|---|---|---|
| | | | WIDTH INSIDE TRENCH | | |
| TREATMENT CONDITION | CORNER SHAPE OF TRENCH | | UPPER | MIDDLE | BOTTOM |
| | OPENING | BOTTOM | PORTION | PORTION | PORTION |
| BEFORE TREATMENT | SHARP | SHARP | 1366 nm | 1286 nm | 1059 nm |
| EXAMPLE 1 SEALED Ar PRESSURE 10 kPa HEATING FOR 5 MINUTES | ROUNDED | ROUNDED | 1331 nm | 1199 nm | 1036 nm |
| EXAMPLE 2 SEALED Ar PRESSURE 10 kPa HEATING FOR 30 MINUTES | ROUNDED | ROUNDED | 1394 nm | 1251 nm | 1076 nm |

TABLE 1-continued

| TREATMENT CONDITION | CORNER SHAPE OF TRENCH | | WIDTH INSIDE TRENCH | | |
|---|---|---|---|---|---|
| | OPENING | BOTTOM | UPPER PORTION | MIDDLE PORTION | BOTTOM PORTION |
| COMPARATIVE EXAMPLE 1 Ar FLOW PRESSURE 10 kPa HEATING FOR 5 MINUTES | DEFORMED | ROUNDED BUT ASPERITIES ON BOTTOM | 1430 nm | 1334 nm | 1139 nm |
| COMPARATIVE EXAMPLE 2 SEALED Ar PRESSURE 100 Pa HEATING FOR 5 MINUTES | SHARP TO SOME EXTENT | ROUNDED BUT LAYER WHERE Si DETACHED ON SIDES | 1486 nm | 1303 nm | 1084 nm |

The invention claimed is:

1. A heat treatment method for a semiconductor substrate, comprising performing a heat treatment at a temperature from 1500° C. to 2000° C. on a semiconductor substrate in a treatment chamber where an inert gas is sealed on a surface of a recess formed in the semiconductor substrate at a pressure from 1 kPa to 100 kPa for suppressing sublimation of a material of the semiconductor substrate, while exhaust from the treatment chamber is stopped.

2. The heat treatment method according to claim 1, wherein by using heating means having a substrate opposed face that is opposed to the semiconductor substrate and heats the semiconductor substrate by radiating heat, the heat treatment on the semiconductor substrate is performed in a second state where the semiconductor substrate and the substrate opposed face are positioned closer to each other than in a first state where the semiconductor substrate is transferred into and firstly placed in the treatment chamber.

3. The heat treatment method according to claim 1, wherein when a heat treatment temperature of the semiconductor substrate in the heat treatment is 1500° C. to 1750° C., the pressure of the inert gas sealed in the treatment chamber is set to 10 kPa or higher, and wherein when the heat treatment temperature of the semiconductor substrate in the heat treatment is 1750° C. to 2000° C., the pressure of the inert gas sealed in the treatment chamber is set to 50 kPa or higher.

4. The heat treatment method according to claim 1, wherein the recess is a trench formed in the semiconductor substrate.

5. The heat treatment method according to claim 1, wherein the semiconductor substrate is a SiC substrate.

6. A heat treatment apparatus comprising:
a treatment chamber in which a heat treatment is performed on a semiconductor substrate;
heating means provided in the treatment chamber; and
a control apparatus that performs the heat treatment at a temperature from 1500° C. to 2000° C. with the heating means on the semiconductor substrate in the treatment chamber where an inert gas is sealed on a surface of a recess formed in the semiconductor substrate at a pressure from 1 kPa to 100 kPa for suppressing sublimation of a material of the semiconductor substrate, while exhaust from the treatment chamber is stopped.

7. The heat treatment apparatus according to claim 6, wherein the heating means has a substrate opposed face that is opposed to the semiconductor substrate and heats the semiconductor substrate by radiating heat, and wherein the control apparatus performs the heat treatment on the semiconductor substrate in a second state where the semiconductor substrate and the substrate opposed face are positioned closer to each other than in a first state where the semiconductor substrate is transferred into and firstly placed in the treatment chamber.

* * * * *